(12) United States Patent
Simkins et al.

(10) Patent No.: US 8,543,635 B2
(45) Date of Patent: Sep. 24, 2013

(54) DIGITAL SIGNAL PROCESSING BLOCK WITH PREADDER STAGE

(75) Inventors: James M. Simkins, Park City, UT (US); Alvin Y. Ching, Sunnyvale, CA (US); John M. Thendean, Pleasanton, CA (US); Vasisht M. Vadi, San Jose, CA (US); Chi Fung Poon, San Jose, CA (US); Muhammad Asim Rab, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 1030 days.

(21) Appl. No.: 12/360,836

(22) Filed: Jan. 27, 2009

(65) Prior Publication Data

US 2010/0191786 A1 Jul. 29, 2010

(51) Int. Cl.
*G06F 7/50* (2006.01)
*H01L 25/00* (2006.01)

(52) U.S. Cl.
USPC .............................. 708/670; 708/703; 326/47

(58) Field of Classification Search
USPC ............. 708/490, 670, 700, 703; 326/37–38, 326/46–47
See application file for complete search history.

(56) References Cited

U.S. PATENT DOCUMENTS

| | | | |
|---|---|---|---|
| 4,041,461 A | 8/1977 | Kratz et al. | |
| 4,541,048 A | 9/1985 | Propster et al. | |
| 4,638,450 A | 1/1987 | Stoffers | |
| 4,639,888 A | 1/1987 | Nussbaecher | |
| 4,665,500 A | 5/1987 | Poland | |
| 4,680,628 A | 7/1987 | Wojcik et al. | |
| 4,755,962 A | 7/1988 | Mor | |
| 4,779,220 A | 10/1988 | Nukiyama | |
| 4,780,842 A | 10/1988 | Morton et al. | |
| 5,095,523 A | 3/1992 | Delaruelle et al. | |
| 5,162,666 A * | 11/1992 | Tran ............................ | 327/408 |
| 5,165,034 A | 11/1992 | Kanuma | |
| 5,241,492 A | 8/1993 | Girardeau, Jr. | |
| 5,258,939 A | 11/1993 | Johnstone et al. | |
| 5,317,530 A | 5/1994 | Toriumi | |

(Continued)

FOREIGN PATENT DOCUMENTS

| | | |
|---|---|---|
| GB | 2 365 636 A | 2/2002 |
| GB | 2 373 883 A | 10/2002 |

(Continued)

OTHER PUBLICATIONS

Xilinx Inc., "XtremeDSP Design Considerations User Guide", v1.2, Feb. 2005.*

(Continued)

*Primary Examiner* — Chat Do
*Assistant Examiner* — Matthew Sandifer
(74) *Attorney, Agent, or Firm* — W. Eric Webostad; John J. King

(57) ABSTRACT

A digital signal processing block with a preadder stage for an integrated circuit is described. The digital signal processing block includes a preadder stage and a control bus. The control bus is coupled to the preadder stage for dynamically controlling operation of the preadder stage. The preadder stage includes: a first input port of a first multiplexer coupled to the control bus; a second input port of a first logic gate coupled to the control bus; a third input port of a second logic gate coupled to the control bus; and a fourth input port of an adder/subtractor coupled to the control bus.

20 Claims, 11 Drawing Sheets

(56) References Cited

U.S. PATENT DOCUMENTS

| | | | |
|---|---|---|---|
| 5,329,460 A | 7/1994 | Agrawal et al. | |
| 5,339,264 A | 8/1994 | Said et al. | |
| 5,349,250 A | 9/1994 | New et al. | |
| 5,359,536 A | 10/1994 | Agrawal et al. | |
| 5,388,062 A | 2/1995 | Knutson | |
| 5,450,056 A | 9/1995 | Jens | |
| 5,450,339 A | 9/1995 | Chester et al. | |
| 5,455,525 A | 10/1995 | Ho et al. | |
| 5,506,799 A | 4/1996 | Nakao | |
| 5,524,244 A | 6/1996 | Robinson et al. | |
| 5,570,306 A | 10/1996 | Soo | |
| 5,572,207 A | 11/1996 | Harding et al. | |
| 5,581,357 A | 12/1996 | Sasaki et al. | |
| 5,600,265 A | 2/1997 | El Gamal et al. | |
| 5,606,520 A | 2/1997 | Gove et al. | |
| 5,630,160 A | 5/1997 | Simpson et al. | |
| 5,724,276 A | 3/1998 | Rose et al. | |
| 5,727,225 A | 3/1998 | Guttag et al. | |
| 5,732,004 A | 3/1998 | Brown | |
| 5,754,459 A | 5/1998 | Telikepalli | |
| 5,805,913 A | 9/1998 | Guttag et al. | |
| 5,809,292 A | 9/1998 | Wilkinson et al. | |
| 5,828,229 A | 10/1998 | Ahanin et al. | |
| 5,835,393 A * | 11/1998 | Melanson et al. | 708/628 |
| 5,838,165 A | 11/1998 | Chatter | |
| 5,847,580 A * | 12/1998 | Bapat et al. | 326/82 |
| 5,880,671 A | 3/1999 | Ranson et al. | |
| 5,883,525 A | 3/1999 | Tavana et al. | |
| 5,896,307 A | 4/1999 | Volkonsky | |
| 5,905,661 A | 5/1999 | Volkonsky | |
| 5,914,616 A | 6/1999 | Young et al. | |
| 5,923,579 A | 7/1999 | Widigen et al. | |
| 5,933,023 A | 8/1999 | Young | |
| 5,943,250 A | 8/1999 | Kim et al. | |
| 5,948,053 A | 9/1999 | Kamiya | |
| 6,000,835 A | 12/1999 | Pan et al. | |
| 6,014,684 A | 1/2000 | Hoffman | |
| 6,038,381 A | 3/2000 | Munch et al. | |
| 6,038,583 A | 3/2000 | Oberman et al. | |
| 6,044,392 A | 3/2000 | Anderson et al. | |
| 6,065,034 A | 5/2000 | Mahurin | |
| 6,069,490 A | 5/2000 | Ochotta et al. | |
| 6,100,715 A | 8/2000 | Agrawal et al. | |
| 6,108,343 A | 8/2000 | Cruickshank et al. | |
| 6,125,381 A | 9/2000 | Paysan | |
| 6,131,105 A | 10/2000 | Pajarre et al. | |
| 6,134,574 A | 10/2000 | Oberman et al. | |
| 6,154,049 A | 11/2000 | New | |
| 6,204,689 B1 | 3/2001 | Percey et al. | |
| 6,223,198 B1 | 4/2001 | Oberman et al. | |
| 6,243,808 B1 | 6/2001 | Wang | |
| 6,249,144 B1 | 6/2001 | Agrawal et al. | |
| 6,260,053 B1 | 7/2001 | Maulik et al. | |
| 6,269,384 B1 | 7/2001 | Oberman | |
| 6,282,627 B1 | 8/2001 | Wong et al. | |
| 6,282,631 B1 | 8/2001 | Arbel | |
| 6,288,566 B1 | 9/2001 | Hanrahan et al. | |
| 6,298,366 B1 | 10/2001 | Gatherer et al. | |
| 6,298,472 B1 | 10/2001 | Phillips et al. | |
| 6,311,200 B1 | 10/2001 | Hanrahan et al. | |
| 6,323,680 B1 | 11/2001 | Pedersen et al. | |
| 6,341,318 B1 | 1/2002 | Dakhil | |
| 6,347,346 B1 | 2/2002 | Taylor | |
| 6,349,346 B1 | 2/2002 | Hanrahan et al. | |
| 6,362,650 B1 | 3/2002 | New et al. | |
| 6,366,943 B1 | 4/2002 | Clinton | |
| 6,370,596 B1 | 4/2002 | Dakhil | |
| 6,374,312 B1 | 4/2002 | Pearce et al. | |
| 6,389,579 B1 | 5/2002 | Phillips et al. | |
| 6,392,912 B1 | 5/2002 | Hanrahan et al. | |
| 6,397,238 B2 | 5/2002 | Oberman et al. | |
| 6,405,298 B1 | 6/2002 | Zeng | |
| 6,421,698 B1 | 7/2002 | Hong | |
| 6,434,584 B1 | 8/2002 | Henderson et al. | |
| 6,438,570 B1 | 8/2002 | Miller | |
| 6,448,808 B2 | 9/2002 | Young et al. | |
| 6,449,708 B2 | 9/2002 | Dewhurst et al. | |
| 6,457,116 B1 | 9/2002 | Mirsky et al. | |
| 6,483,343 B1 | 11/2002 | Faith et al. | |
| 6,496,918 B1 | 12/2002 | DeHon et al. | |
| 6,499,045 B1 | 12/2002 | Turney et al. | |
| 6,519,674 B1 | 2/2003 | Lam et al. | |
| 6,526,430 B1 | 2/2003 | Hung et al. | |
| 6,526,557 B1 | 2/2003 | Young et al. | |
| 6,530,010 B1 * | 3/2003 | Hung et al. | 712/1 |
| 6,538,470 B1 | 3/2003 | Langhammer et al. | |
| 6,539,477 B1 | 3/2003 | Seawright | |
| 6,556,044 B2 | 4/2003 | Langhammer et al. | |
| 6,567,835 B1 | 5/2003 | Blomgren et al. | |
| 6,573,749 B2 | 6/2003 | New et al. | |
| 6,631,508 B1 | 10/2003 | Williams | |
| 6,693,455 B2 | 2/2004 | Langhammer et al. | |
| 6,728,744 B2 | 4/2004 | Amer | |
| 6,731,706 B1 | 5/2004 | Acharya et al. | |
| 6,732,132 B2 | 5/2004 | Sogo | |
| 6,742,013 B2 | 5/2004 | Griesemer | |
| 6,754,689 B2 | 6/2004 | Bhushan et al. | |
| 6,820,102 B2 | 11/2004 | Aldrich et al. | |
| 6,864,714 B2 | 3/2005 | Digari et al. | |
| 6,873,182 B2 | 3/2005 | Mohan et al. | |
| 6,904,446 B2 | 6/2005 | Dibrino | |
| 6,920,627 B2 | 7/2005 | Blodget et al. | |
| 6,925,480 B2 | 8/2005 | Duborgel | |
| 6,947,916 B2 | 9/2005 | Luo et al. | |
| 7,116,663 B2 | 10/2006 | Liao | |
| 7,124,156 B2 | 10/2006 | Yang et al. | |
| 7,124,160 B2 | 10/2006 | Saulsbury et al. | |
| 7,129,762 B1 | 10/2006 | Vadi | |
| 7,142,010 B2 | 11/2006 | Langhammer et al. | |
| 7,174,432 B2 | 2/2007 | Howard et al. | |
| 7,178,130 B2 | 2/2007 | Chuang et al. | |
| 7,193,433 B1 | 3/2007 | Young | |
| 7,194,598 B2 | 3/2007 | Jacob | |
| 7,194,605 B2 | 3/2007 | Ramchandran | |
| 7,197,686 B2 | 3/2007 | Box et al. | |
| 7,218,139 B1 | 5/2007 | Young et al. | |
| 7,225,279 B2 | 5/2007 | Scheuermann | |
| 7,230,451 B1 * | 6/2007 | Langhammer | 326/41 |
| 7,249,242 B2 | 7/2007 | Ramchandran | |
| 7,340,562 B2 | 3/2008 | Ramchandran | |
| 7,353,243 B2 | 4/2008 | Scheuermann | |
| 7,353,516 B2 | 4/2008 | Heidari-Bateni et al. | |
| 7,433,909 B2 * | 10/2008 | Scheuermann | 708/400 |
| 7,467,175 B2 | 12/2008 | Simkins et al. | |
| 7,467,177 B2 | 12/2008 | Simkins et al. | |
| 7,472,155 B2 | 12/2008 | Simkins et al. | |
| 7,480,690 B2 | 1/2009 | Simkins et al. | |
| 7,483,420 B1 | 1/2009 | Esposito | |
| 7,502,915 B2 | 3/2009 | Jacob | |
| 7,567,997 B2 * | 7/2009 | Simkins et al. | 708/523 |
| 7,580,963 B2 | 8/2009 | Kawano et al. | |
| 7,689,640 B2 | 3/2010 | Renno et al. | |
| 7,702,710 B2 * | 4/2010 | Domingo | 708/313 |
| 7,840,627 B2 | 11/2010 | Simkins et al. | |
| 7,840,630 B2 | 11/2010 | Wong et al. | |
| 7,844,653 B2 | 11/2010 | Simkins et al. | |
| 7,849,119 B2 | 12/2010 | Vadi et al. | |
| 7,853,632 B2 | 12/2010 | Ching et al. | |
| 7,853,634 B2 | 12/2010 | Simkins et al. | |
| 7,853,636 B2 | 12/2010 | New et al. | |
| 7,860,915 B2 | 12/2010 | Vadi et al. | |
| 7,865,542 B2 | 1/2011 | New et al. | |
| 7,870,182 B2 | 1/2011 | Thendean et al. | |
| 7,882,165 B2 | 2/2011 | Simkins et al. | |
| 7,949,699 B1 * | 5/2011 | Neoh et al. | 708/313 |
| 8,010,593 B2 * | 8/2011 | Master et al. | 709/201 |
| 8,090,758 B1 * | 1/2012 | Shimanek et al. | 708/523 |
| 2001/0004741 A1 | 6/2001 | Sogo | |
| 2002/0138538 A1 | 9/2002 | Talwar et al. | |
| 2002/0138716 A1 | 9/2002 | Master et al. | |
| 2003/0033342 A1 | 2/2003 | Griesemer | |
| 2003/0055861 A1 | 3/2003 | Lai et al. | |
| 2003/0105793 A1 | 6/2003 | Guttag et al. | |
| 2003/0105949 A1 | 6/2003 | Master et al. | |

| | | | |
|---|---|---|---|
| 2003/0140077 | A1 | 7/2003 | Zaboronski et al. |
| 2003/0154357 | A1 | 8/2003 | Master et al. |
| 2004/0083250 | A1 | 4/2004 | Kiuchi et al. |
| 2004/0158600 | A1 | 8/2004 | Markstein et al. |
| 2004/0181614 | A1 | 9/2004 | Furtek |
| 2005/0038984 | A1 | 2/2005 | Heidari-Bateni et al. |
| 2005/0144210 | A1 | 6/2005 | Simkins et al. |
| 2005/0187998 | A1 | 8/2005 | Zheng et al. |
| 2006/0004902 | A1* | 1/2006 | Simanapalli et al. ......... 708/670 |
| 2006/0015701 | A1 | 1/2006 | Hogenanauer |
| 2006/0064449 | A1 | 3/2006 | Nakamura et al. |
| 2006/0190516 | A1* | 8/2006 | Simkins et al. ............... 708/490 |
| 2006/0190518 | A1 | 8/2006 | Ekner et al. |
| 2006/0212499 | A1 | 9/2006 | New et al. |
| 2006/0218216 | A1 | 9/2006 | Langhammer et al. |
| 2006/0253516 | A1 | 11/2006 | Gangwal et al. |
| 2006/0269054 | A1 | 11/2006 | Dror et al. |
| 2006/0294175 | A1 | 12/2006 | Koob et al. |
| 2009/0019416 | A1 | 1/2009 | Chugh et al. |

FOREIGN PATENT DOCUMENTS

| | | |
|---|---|---|
| GB | 2 383 435 A | 6/2003 |
| JP | 08-65107 | 3/1996 |
| WO | WO 94/01933 A1 | 1/1994 |
| WO | WO 2001/089091 A2 | 11/2001 |
| WO | WO 2005/066832 A2 | 7/2005 |
| WO | WO 2005/110049 A2 | 11/2005 |

OTHER PUBLICATIONS

Written Opinion of the International Search Authority for PCT/US2010/020565, mailed Jul. 27, 2011, retrieved from wipo.org.*

"Xtreme DSP DSP48A for Spartan-3A DSP FPGAs", User Guide, UG431 (v1.3), Jul. 15, 2008, available from Xilinx, Inc., of San Jose, California.

U.S. Appl No. 12/418,979, filed Apr. 6, 2009, Wendling, Xavier and Simkins, James M., Xilinx, Inc. 2100 Logic Drive, San Jose, CA.

ISE 10.1 In-Depth Tutorial, 168 pages, May 30, 2008, available at www.xilinx.com, Xilinx, Inc. 2100 Logic Drive, San Jose, CA.

Parhami, B., "Computer Arithmetic, Algorithms and Hardware Designs", 2000, Oxford University Press, Inc., New York, NY, USA, 239790, XP002570130, 432-443 pp.

Masud et al., "Reusable Silicon IP Cores for Discrete Wavelet Transform Applications", IEEE Transactions on Circuits and Systems, Part I: Regular Papers IEEE Service Center, NY, NY, vol. 51, No. 6, Jun. 1, 2004, pp. 1114-1124, XP011113915.

Mar, M.F. et al., "Digital filter design for compact on-chip oversampling A/D conversion", IEEE 1993 Custom Integrated Circuits Conference, Proceedings of the IEEE 1993 San Diego, CA, USA, May 9-12, 1993, NY, NY, pp. 15.2.1-15.2.4, XP010222127.

Advanced Micro Devices; "The Am29116 Family"; Bipolar Microprocessor Logic and Interface Data Book; Copyright 1981 Advanced Micro Devices, Inc., pp. 8-3 through 8-20.

Advanced Micro Devices; "The Am29500 Family"; Bipolar Microprocessor Logic and Interface Data Book; Copyright 1985 Advanced Micro Devices, Inc., pp. 71-through 7-96.

Alliance Core; "ARC 32-bit Configurable RISC/DSP Processor" Jul. 3, 2000; Product Specification; ARC International; AR House, United Kingdom; pp. 1-7.

Altera, "Using PLDs for High-Performance DSP Applications", White Paper, WP-STXDSP-1.0; Feb. 2002, Ver. 1.0; Preliminary Information; pp. 1-6.

Altera; "FPGAs Provide Reconfigurable DSP Solutions", White Paper; WP-FPGA/DSP-1.0; Aug. 2002, ver. 1.0; pp. 1-6.

Arithmatica "Contact Arithmatica": downloaded from http://www.arithmatica.com/aplus.html , on Nov. 10, 2003; pp. 1.

Arithmatica; "A+ Fast Carry-Propagate for Adders", downloaded from http://www.arithmatica.com/aplus.html on Nov. 10, 2003; pp. 1-2.

BDTi, Berkeley Design Technology, Inc.; "Choosing a DSP Processor", 1996-2000 Berkeley Design Technology, Inc.; Oct. 1996, pp. 1-8.

BDTi; "Evaluating FPGAs for Communication Infrastructure Applications", 2002 Berkeley Design Technology, Inc.; SDR Forum, Nov. 2002 Conference; pp. 1-6.

Bradshaw, Stephen, J.: "Building a Better DSP Mousetrap: FPGAs DSP Processors, or a combination of both?" Copyright 2001 Traquair Data Systems, Inc.; rev. 1.1.; Nov. 1, 2001: available from www.traquair.com: pp. 1-6.

Chou, Chi-Jui et al., "FPGA Implementation of Digital Filters" Fourth International Conference on Signal Processing Applications and Technology, ICSPAT' 93, Sep. 28-Oct. 1, 1993, Santa Clara, CA USA., pp. 1-9.

David, Raphael et al., "DART: A Dynamically Reconfigurable Architecture Dealing with Future Mobile Telecommunications Constraints"; Parallel and Distributed Processing Symposium; Proceedings International, IPDPS 2002; Copyright 2002 IEEE; Apr. 15-19, 2002; pp. 156-163.

Dhanesha, Hema et al., "Array of arrays Architecture for Parallel floating Point Multiplication": Center for Integrated Systems, Stanford University, 1995 Conference on Advanced Research in VLSI, Chapel Hill, NC, Advanced Research in VLSI, Proceedings, Sixteenth Conference on Volume, Issue, Mar. 27-29, 1995, pp. 150-157.

Evans, Joseph B., "Efficient FIR Filter Architectures Suitable for FPGA Implementation", presented at ISCAS 1993 in Chicago, Illinois; pp. 1-6.

Even, Guy et al.; "A Comparison of Three Rounding Algorithms for IEEE Floating-Point Multiplication", Aug. 29, 1998; pp. 1-30.

Eyre, Jennifer, et al., "The Evolution of DSP Processors", a BDTi White Paper; Copyright 2000 Berkeley Design Technology, Inc.; pp. 1-9.

Fried, Rafael, "Algorithms for Power Consumption Reduction and Speed Enhancement in High-Performance Parallel Multipliers", PATMOS-97; Seventh International workshop Program; downloaded from http://www.dice.uci.ac.be/anmarie/patmos_papers/S2/2_1.html on Nov. 10, 2003; pp. 1-11.

Fujioka, Y. et al., "Design of a Reconfigurable Parallel Processor for Digital control Using FPGAs", IEICE Transactions on Electronics, Institute of Electronics Information and communications; vol. E77-C, No. 7; Jul. 1994; pp. 1123-1129.

Ghazal, Naji S. et al.; "Retargetable Estimation for DSP Architecture Selection", Tampere Technology Seminar, Nov. 1999, available from http://www-cad.eecs.berkeley.edu/~naji/Research/; pp. 1-33.

Goslin, Gregory Ray: "A Guide to Using Field Programmable Gate Arrays (FPGAs) for Application-Specific Digital Signal Processing Performance"; 1995 Xilinx, Inc.; v1.0; pp. 1-11.

Harmon, Gary, "Silicon Arithmetic with a 40% Advantage", White Paper, AutoPD; Mar. 19, 2003, pp. 1-3.

Huang, Zhijun, e al., "Low Power Array Multiplier Design by Topology Optimization" , Proceeding-SPIE the International Society of Engineering, Dec. 6, 2002, ISSU, Proceeding vol. 4791, pp. 424-435.

Jovanovic-Dolecek, Gordana, et al.; "Design of FIR Lowpass Filters Using Stepped Triangular Approximation": 5th Nordic Signal Processing Symposium, NORSIG 2002, Oct. 4-7, 2002, from Tromso to Trondheim, Norway, pp. 1-4.

Knapp, Steven K.; "Using Programmable Logic to Accelerate DSP Functions", Copyright 1995 by Xilinx, Inc. available from http://www.xilinx.com: pp. 1-8.

Lee, Edward A., "Programmable DSP Architectures: Part II", IEEE ASSP Magazine: Jan. 1989; pp. 4-14.

Leitung: Prof. Dr. Miroslaw Malek; Humbolt-Universitat Zu Berlin, Institute for Informaltik; Lecture 12; ALU (3)—Division Algorithms; Sommersemester 2002; available from www.informatik.hu-berlin.ed/tok/ca; pp. 1-29.

Lim, Yong Ching, et al., "An Efficient Bit-Serial FIR Filter Architecture" supported by Office of Naval Research under Grant N00014-89-J1327, NSF Grant ECS87-13598, by an AT&T Bell Laboratories Graduate Fellowship and by University of Kansas General Research Allocation 3775-20/0038; Presented at ICASSP-90, Apr. 3-6, 1990, Albuquerque, New Mexico, pp. 1-13.

Mciihenny, Robert et al., "On the Implementation of a Three-Operand Multiplier", pp. 1-5, 31st Asilomar Conference on Signals, Systems, and Computers, Pacific Grove, CA, Nov. 2-5, 1997.

Mirsky, E., Dehon, A., "MATRIX: A Reconfigurable Computing Device with Configurable Instruction Distribution (Extended Abstract)", in Proc. IEEE Workshop on FPGAs for Custom Computing Machines, 1996, pp. 1-3.

Mirsky, E., Dehon, A.,"MATRIX: A Reconfigurable Computing Architecture with Configurable Instruction Distribution and Deployable Resources", In Proc. IEEE Workshop on FPGAs for Custom Computing Machines, Apr. 17-19, 1996, pp. 1-10.

Mohanakrishnan, Satish et al., "Automatic Implementation of FIR Filters on Field Programmable Gate Arrays", Oct. 7, 1993; supported by Kansas Technology Enterprise Corp.; pp. 1-12.

Nicolaidis, M., et al., "Design of Fault-Secure Parity-Prediction Booth Multipliers"; Design, Automation and Test in Europe, 1998, Proceedings, Volume, Issue, Feb. 23-26, 1998, pp. 7-14.

Palacharla, S., Jouppi N, P., Smith, J. E. "Complexity-effective superscalar processors ", In Proc. The 24th Annual Int. Symp. Computer Architecture, Denver, CO, Jun. 1997, pp. 206-218.

Parhami, Behrooz, et al.; "Parallel Architectures and Adaptation Algorithms for Programmable FIR Digital Filters with Fully Pipelined Data and Control Flows", Journal of Information Science and Engineering 19, 59-74, (2003) ; accepted Apr. 15, 2002; pp. 59-74.

Peterson, Russell, J.; "An Assessment of the Suitability of Reconfigurable Systems for Digital Signal Processing "; A Thesis Submitted to the Department of Electrical and computer Engineering Brigham Young University, Sep. 27, 1995; pp. 1-138.

Reeves, Keith, et al., "Reconfigurable Hardware Accelerator for Embedded DSP" High-Speed Computing, Digital Signal Processing, and Filtering Using Reconfigurable Logic, Proc. SPIE, vol. 2914, 332, Nov. 20, 1996, Boston, MA, pp. 929-933.

Simkins, Jim et al., "A Reconfigurable VME Spread-Spectrum LPI (Low Probability of Intercept) Datalink Receiver/Transmitter Implemented via Reconfigurable DSP Hardware": IEEE Transactions on Acoustics, Speech, and Signal Processing, vol. ASSP-29, No. 2: Apr. 1981; pp. 1-14.

Turney, Robert D., et al., "Modeling and Implementation of DSP FPGA Solutions" 1999 International Conference on Signal Processing Applications and Technology ICSPAT, Nov. 3, 1999, pp. 1-16.

University of Patras—DCT-Hellas; "ESD Best Practice: Pilot Action for Low Power Design—SOFLOPO Low Power Software Development for Embedded Applications ", May 1998; pp. 1-100.

Wilson, Drew, "Chameleon Takes on FPGAs, ASICs", Electronic News; Oct. 29, 2004: downloaded from http://www.reed-electronics.com/electronicnews/article/CA50551:pubdate=10%2F16%2. on Oct. 29, 2004; pp. 1-6.

Xilinx, Inc., "FPGAs and DSP", Nov. 1996, 1-8, available from Xilinx, Inc., 2100 Logic Drive, San Jose, CA USA.

Xilinx, Inc., "The Programmable Logic Data Book 1999," pp. 1-62, available from Xilinx, Inc., 2100 Logic Drive, San Jose, CA USA.

Xilinx, Inc., "Virtex4 FPGA Handbook" Ch. 10 XtremeDSP Design Considerations, Aug. 2, 2004, pp. 461-508, available from Xilinx, Inc., 2100 Logic Drive, San Jose, CA USA.

Xilinx, Inc., "Virtex4 Handbook" Aug. 2, 2004, pp. 1-632, available from Xilinx, Inc., 2100 Logic Drive, San Jose, CA USA.

Xilinx, Inc., Allaire, Bill, et al., "Block Adaptive Filter": Application Note; XAPP 055; Jan. 9, 1997 (Version 1.1); pp. 1-10.available from Xilinx, Inc., 2100 Logic Drive, San Jose, CA USA.

Yu, Hyeong Seok, et al., "Low Area CMOS Multiplication Using Booth Algorithm for IEEE 754 Floating Point Standard"; $6^{th}$ Korean Semiconductor Conference, D-48, Feb. 9, 1999, pp. 1-5, Seoul, Korea.

\* cited by examiner

| INMODE[4] | INMODE[3] | INMODE[2] | INMODE[1] | INMODE[0] | USE_DPORT | Mult. A Port | Mult. B Port |
|---|---|---|---|---|---|---|---|
| 0/1 | 0 | 0 | 0 | 0 | FALSE | A2 | B2/B1 |
| 0/1 | 0 | 0 | 0 | 1 | FALSE | A1 | B2/B1 |
| 0/1 | 0 | 0 | 1 | 0 | FALSE | Zero | B2/B1 |
| 0/1 | 0 | 0 | 1 | 1 | FALSE | Zero | B2/B1 |
| 0/1 | 0 | 1 | 0 | 0 | TRUE | A2 | B2/B1 |
| 0/1 | 0 | 1 | 0 | 1 | TRUE | A1 | B2/B1 |
| 0/1 | 0 | 1 | 1 | 0 | TRUE | Zero | B2/B1 |
| 0/1 | 0 | 1 | 1 | 1 | TRUE | Zero | B2/B1 |
| 0/1 | 1 | 0 | 0 | 0 | TRUE | D+A2 | B2/B1 |
| 0/1 | 1 | 0 | 0 | 1 | TRUE | D+A1 | B2/B1 |
| 0/1 | 1 | 0 | 1 | 0 | TRUE | D1 | B2/B1 |
| 0/1 | 1 | 0 | 1 | 1 | TRUE | D1 | B2/B1 |
| 0/1 | 1 | 1 | 0 | 0 | TRUE | -A2 | B2/B1 |
| 0/1 | 1 | 1 | 0 | 1 | TRUE | -A1 | B2/B1 |
| 0/1 | 1 | 1 | 1 | 0 | TRUE | Zero | B2/B1 |
| 0/1 | 1 | 1 | 1 | 1 | TRUE | Zero | B2/B1 |
| 0/1 | 1 | 0 | 0 | 0 | TRUE | D-A2 | B2/B1 |
| 0/1 | 1 | 0 | 0 | 1 | TRUE | D-A1 | B2/B1 |
| 0/1 | 1 | 0 | 1 | 0 | TRUE | D | B2/B1 |
| 0/1 | 1 | 1 | 1 | 1 | TRUE | D | B2/B1 |

FIG. 5

DIGITAL SIGNAL PROCESSING BLOCK WITH PREADDER STAGE

FIELD OF THE INVENTION

The invention relates to integrated circuit devices ("ICs"). More particularly, the invention relates to a digital signal processing block with a preadder stage for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Performance of a design instantiated in programmable logic of an FPGA ("FPGA fabric") is limited by the speed of the FPGA fabric. However, dedicated circuit resources, such as DSPs in an FPGA, are capable of performing operations faster than equivalent circuits implemented in FPGA fabric. Accordingly, it would be desirable and useful to provide means for expanding the usefulness of DSPs.

SUMMARY OF THE INVENTION

One or more embodiments generally relate to integrated circuit devices ("ICs") and, more particularly, to a digital signal processing block with a preadder stage for an IC.

One embodiment of the present invention relates generally to an integrated circuit with a digital signal processing block. The digital signal processing block includes a preadder stage and a control bus. The control bus is coupled to the preadder stage for dynamically controlling operation of the preadder stage. The preadder stage includes: a first input port of a first multiplexer coupled to the control bus; a second input port of a first logic gate coupled to the control bus; a third input port of a second logic gate coupled to the control bus; and a fourth input port of an adder/subtractor coupled to the control bus.

Another embodiment of the present invention relates generally to a systolic finite impulse response filter including a shift register coupled to a chain of digital signal processing blocks. The shift register is configured to broadcast a broadcast input to each first register of all but an ending one of the digital signal processing blocks of the chain. Each of the digital signal processing blocks has a second register. Each of the digital signal processing blocks has a third register. Output of the second register is coupled to input of the third register for each of the digital signal processing blocks to provide dual registers thereof. The dual registers is coupled in series for propagating a filter input series from a starting one of the digital signal processing blocks to the ending one of the digital signal processing blocks of the chain. Each of the digital signal processing blocks has a first adder coupled for receiving output from each of the first register and the third register for providing a first sum thereof. Each of the digital signal processing blocks has a fourth register coupled for receiving a respective filter coefficient. Each of the digital signal processing blocks has a multiplier coupled for receiving the first sum and the filter coefficient respectively thereof and configured for providing a partial result thereof. Each of the digital signal processing blocks has a second adder coupled for receiving the partial result thereof. Second adders of the digital signal processing blocks are coupled for accumulating the partial result of each of the digital signal processing blocks to provide a filter output series from the ending one of the digital signal processing blocks of the chain.

Yet another embodiment of the present invention relates generally to a method for filtering. A filter input series is obtained and provided to a chain of digital signal processing blocks as a first input thereto. Effective length of the digital signal processing blocks is dynamically changed to effectively adjust number of filter taps.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 5 is a table diagram depicting an exemplary embodiment of an inmode function table.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
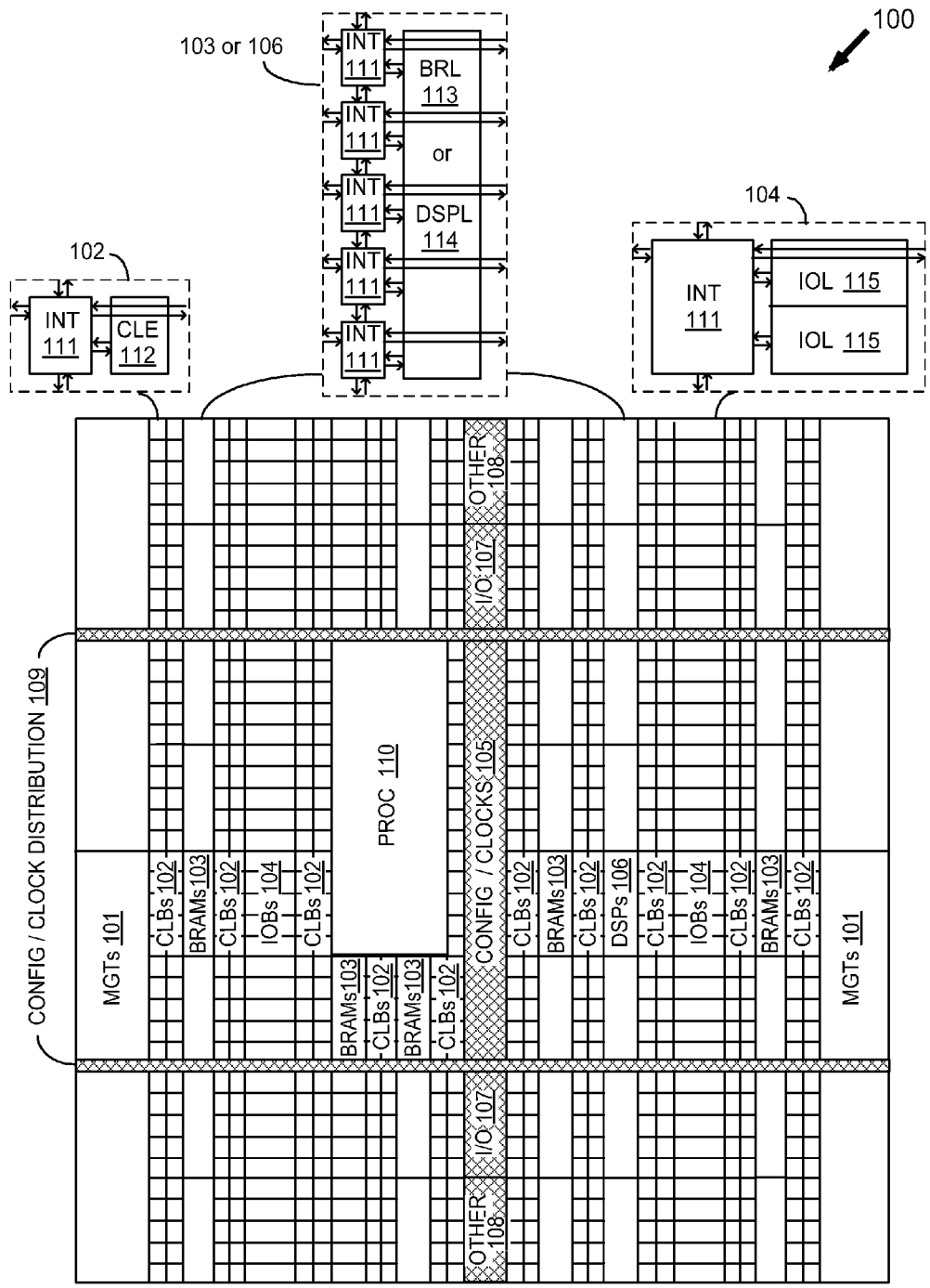
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a columnar area near the center of the die (shown in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

DSPs 106 are described in additional detail in a co-pending patent application entitled "Integrated Circuit with Cascading DSP Slices" by James M. Simkins, et al., assigned application Ser. No. 11/019,783, filed Dec. 21, 2004, which is incorporated by reference herein in its entirety. Example implementations of DSPs 106 may be found in Virtex™ and Spartan™ FPGAs available from Xilinx, Inc., of San Jose, Calif.

Figure 2:
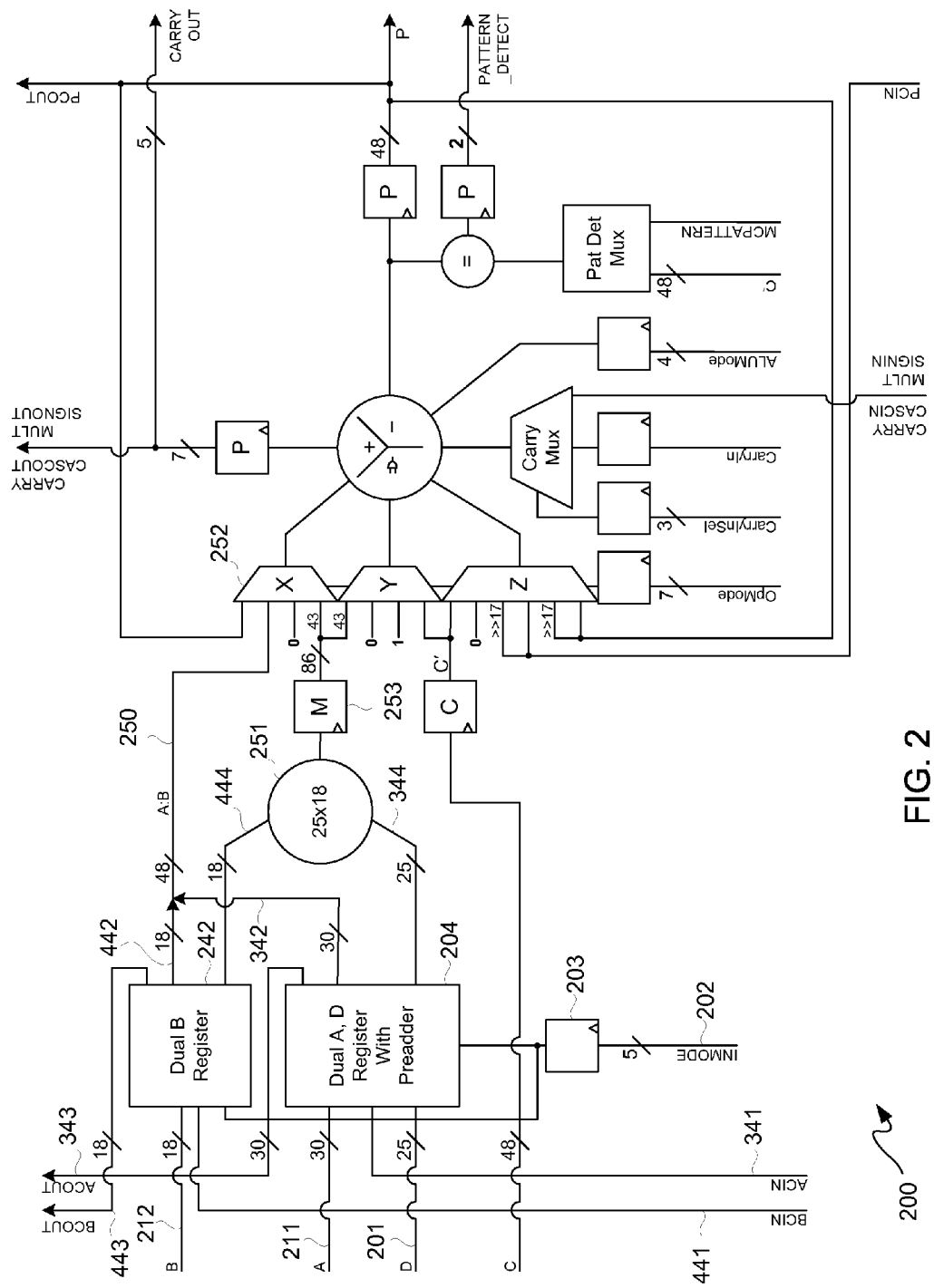
FIG. 2 is a block/circuit diagram depicting an exemplary embodiment of a DSP slice.

FIG. 2 is a block/circuit diagram depicting an exemplary embodiment of a DSP slice 200. DSP slice 200 may, though need not, be an exemplary embodiment of a DSP 106 of FPGA 100 of FIG. 1. D input signal ("input") 201, A input 211, AC input ("ACIN") 341, and input mode signal ("inmode") 202, are provided to a dual A, D register with preadder ("preadder") 204, where inmode 202 is provided to inmode register 203 for preadder 204. B input 212 and BC input ("BCIN") 441 are provided to dual B register 242. Multiplier 251 and M register 253, as well as a C register and other circuitry to the right thereof in FIG. 2, of DSP slice 200 are conventional, and may be found in Virtex-5™ FPGAs. Accordingly, description of such previously known circuitry is avoided for purposes of clarity. Furthermore, the terms "input" and "output" are used to indicate either or both of a signal and a port, including without limitation their plural forms.

Figure 3:
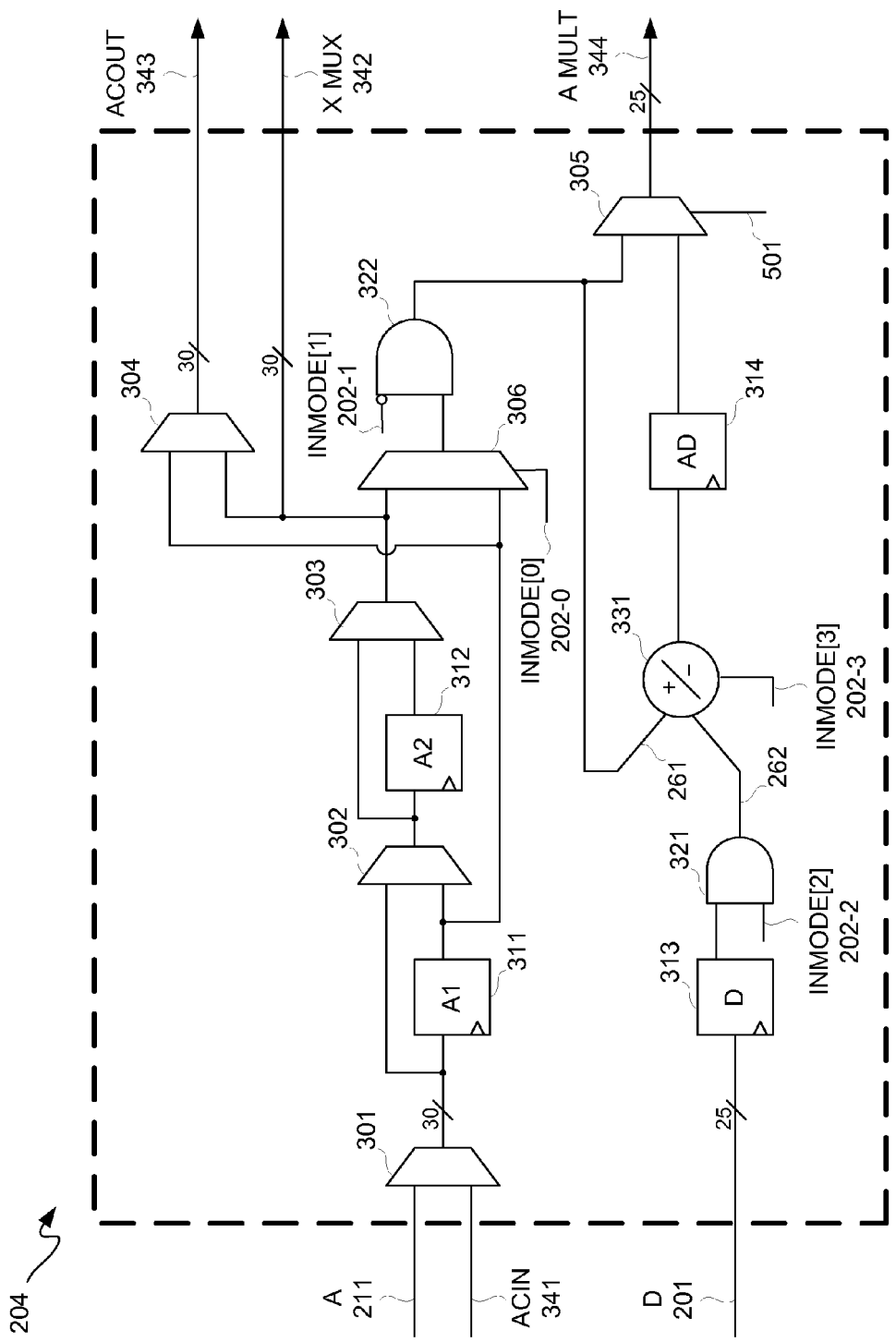
FIG. 3 is a circuit diagram depicting an exemplary embodiment of a preadder of the DSP slice of FIG. 2.

FIG. 3 is a circuit diagram depicting an exemplary embodiment of preadder 204. As described below in additional detail, preadder 204 may be dynamically configured to operate as being 0, 1, 2, or 3 registers deep.

Preadder 204 includes multiplexers 301 through 306, registers 311 through 314, logic gates 321 and 322, and adder/subtractor 331. It should be appreciated that even though bit widths are illustratively shown in FIG. 3, as well as in FIGS. 2 and 4, in accordance with bit widths of a DSP slice of a Virtex-5™ FPGA, bit widths other than, or the same as, those illustratively shown herein, or a combination thereof, may be used.

While not shown for purposes of clarity and not limitation, in this embodiment, control select inputs to multiplexers 301 through 305 are provided from configuration memory cells of FPGA fabric. Such configuration memory cells are configured from a configuration bitstream. Thus, in the context of an FPGA, when such FPGA is obtaining state information as part of a power up cycle, the program states of those memory cells determine selected outputs for multiplexers 301 through 305, and such memory cells are not capable of having their state changed without resetting the FPGA. In other words, the status of multiplexers 301 through 305 during operation is static. In contrast to the static status of multiplexers 301 through 305 during FPGA operation, multiplexer 306 is dynamically operable; in other words, multiplexer 306 may have its control select changed during operation of an FPGA without having to reset such FPGA. Such control select, in this exemplary embodiment, is provided by a portion of inmode 202, namely inmode 202-0, where the "-0" is used to indicate bit position zero of an inmode bus.

Moreover, in addition to dynamic operation of multiplexer 306, logic gates 321 and 322, as well as subtractor 331, may be dynamically operated. Thus, such dynamically operable components may be changed during operation of user design. In this embodiment, inmodes 202-0 through 202-3 of FIG. 3, as well as inmode 202-4 of FIG. 4, may be changed on each cycle of a clock signal. For purposes of clarity by way of example and not limitation, clock signaling such as may be used herein is not shown.

Inmode 202-0 is provided as a dynamic control select signal to multiplexer 306 for gating to provide either A input 211 or AC input 341 as delayed by either of A1 register 311 or A2 register 312, by both A1 register 311 and A2 register 312, or by neither A1 register 311 nor A2 register 312. Again, once selected by memory cell state, a selected output from multiplexers 301 through 305 is static during operation without resetting an FPGA.

Either A input 211 or AC input 341 may be output from multiplexer 301. Output from multiplexer 301 is provided as data input to A1 register 311 and as data input to multiplexer 302. Output of A1 register 311 is provided as data input to multiplexers 302, 304, and 306. Output of multiplexer 302 is provided as data input to A2 register 312 and as data input to multiplexer 303. Output of multiplexer 303 is provided as data input to multiplexers 304 and 306, as well as being provided as an X MUX output 342. Referring to FIG. 2, X MUX output 342 of preadder 204 may be combined with output 442 of dual B register 242 of FIG. 2 for an AB concatenated signal 250.

Returning to FIG. 3, for purposes of clarity by way of example and not limitation, assuming a user has set multiplexers 302 and 303 to select their bottom inputs as outputs, and assuming that a user has selected AC input 341, namely A cascaded input from another DSP slice, as an output of multiplexer 301, then AC input 341 provided as data input to multiplexer 306 is registered by both A1 register 311 and A2 register 312 on an upper data input of multiplexer 306, and on a lower input of multiplexer 306, AC input 341 is registered by just A1 register 311. Accordingly, it should be appreciated that a user may select the register depth to an upper port of multiplexer 306, while the register depth of input to a lower port of multiplexer 306 is always just A1 deep.

As previously mentioned, preadder 204 includes a dual A register and a dual D register. This means, e.g., that A1 register 311 and A2 register 312 are dual-register configurable, even though both A1 and A2 registers, only one of A1 and A2 registers, or neither of A1 and A2 registers may be used in providing input to logic gate 322 via output of multiplexer 306. Furthermore, the dual D register is in reference to D register 313 and AD register 314.

Again, it should be appreciated that the upper input to multiplexer 306, as well as the lower input to multiplexer 304, sourced from the output of multiplexer 301 may be no registers deep, either A1 or A2 deep, or A1 and A2 deep. Furthermore, again, the lower input of multiplexer 306, as well as the upper input of multiplexer 304, is always A1 deep. Output of multiplexer 304 is AC output ("ACOUT") signal ("AC output") 343 of FIG. 2, which may be provided to another DSP slice, similarly to AC input 341 being provided to DSP slice 200 of FIG. 2.

Whether an upper input or a lower input of multiplexer 306 is selected for output is controlled by state of inmode 202-0, and output from multiplexer 306 is provided as data input to logic gate 322. Even though AND gates are illustratively depicted for logic gates 321 and 322, it should be appreciated that other logic gates may be used in accordance with the description herein. The other input of AND gate 322, which is an inverted input, is coupled to receive inmode 202-1. For this embodiment, inmode 202-1 represents bit position one of a bus of inmode 202. Output of AND gate 322 is provided as an input to adder/subtractor 331, namely A path input 261 as described below in additional detail, and to an upper input of multiplexer 305.

D input 201 is provided as data input to D register 313. Data output of D register 313 is provided to an upper input of AND gate 321. A lower input of AND gate 321 is coupled to receive inmode 202-2, which for this embodiment is bit position two of a bus of inmode 202. Output of AND gate 321 is provided as another input to adder/subtractor 331, namely D path input 262 as described below in additional detail. Whether adder/subtractor 331 is configured for adding or subtracting is controlled by inmode 202-3, which for this embodiment is bit position three of a bus of inmode 202. Output of adder/subtractor 331 is provided to a data input port of AD register 314. Output of AD register 314 is provided as another input to multiplexer 305. Output of multiplexer 305 is a multiplier operand signal, namely A multiplier ("A MULT") signal 344 (illustratively shown in FIG. 2).

Again, it should be appreciated that multiplexer 306, AND gate 322, AND gate 321, adder/subtractor 331 are respectively controlled for purposes of dynamic operation by inmodes 202-0 through 202-3, respectively representing bit positions zero through three of a bus of inmode 202. While inmodes 202-0 and 202-3 are used as control select signals for either selecting an output or a function, inmodes 202-1 and 202-2 are operative by their state for affecting or not affecting the output of AND gates 322 and 321, respectively.

In addition to being able to dynamically control AND gates 321 and 322, output of either of AND gates 321 and 322 may be used to source a zero input to adder/subtractor 331. Accordingly, it should be appreciated that if AND gate 322 provides a zero operand input to adder/subtractor 331, then the input of D input 201 which may be provided as an output of multiplexer 305, may pass through registers 313 and 314, namely a two deep register path. Alternatively, if a zero is sourced from the output of AND gate 321, and adder/subtractor 331 is used, then it is possible to have a three deep register path for either of A input 211 or AC input 341, namely through A1 register 311, A2 register 312, and AD register 314.

Figure 4:
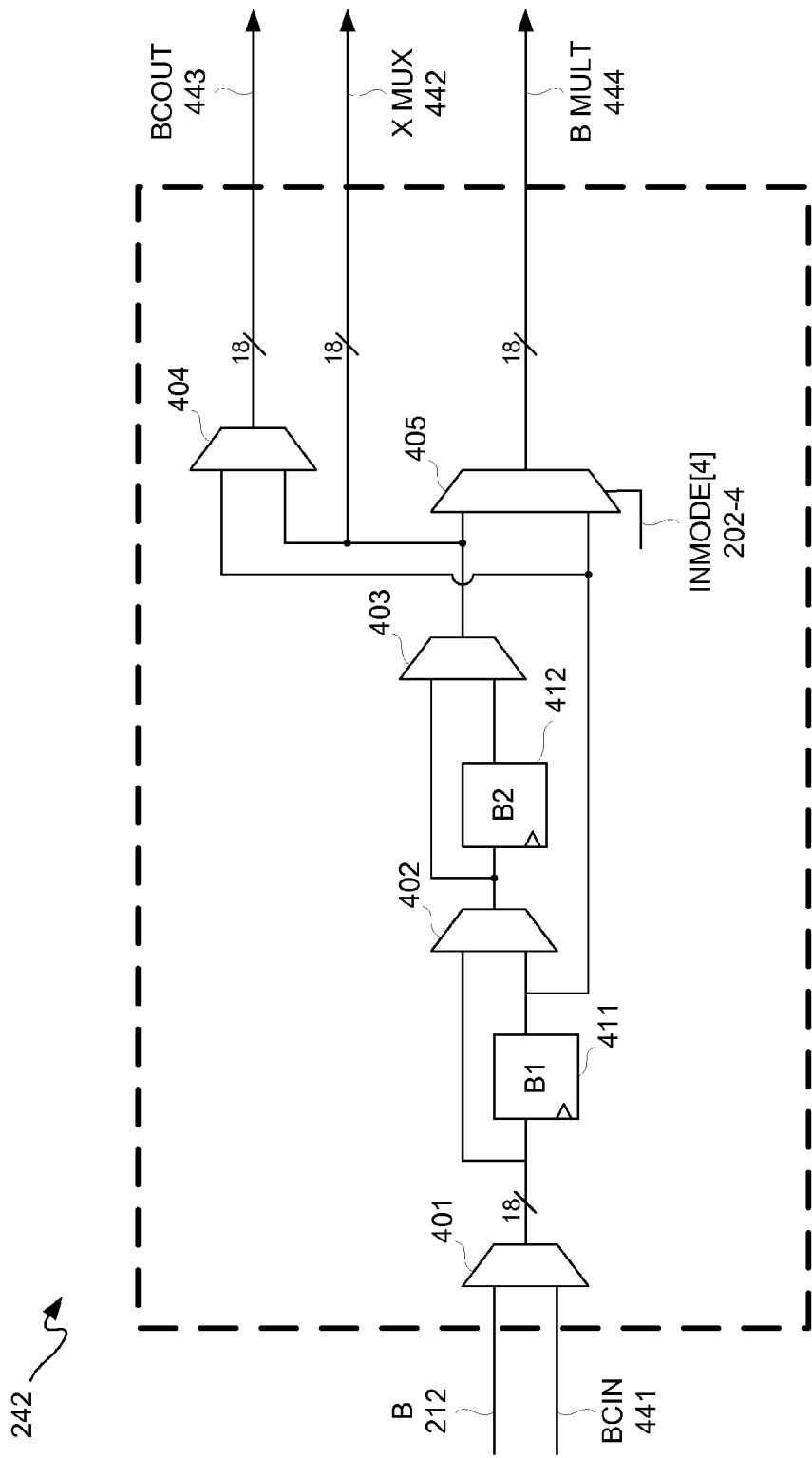
FIG. 4 is a circuit diagram depicting an exemplary embodiment of a dual B register of the DSP slice of FIG. 2.

FIG. 4 is a circuit diagram depicting an exemplary embodiment of dual B register 242 of DSP slice 200 of FIG. 2. B input signal ("B input") 212 and BC input ("BCIN") signal ("BC input") 441 are provided as inputs to multiplexer 401. Multiplexers 401 through 404 of dual B register 242, like multiplexers 301 through 304, are static during operation, namely their outputs are established during configuration of an FPGA and are not dynamically reconfigurable during operation. Multiplexer 405, like multiplexer 306, is dynamically operable responsive to inmode 202-4, which for this embodiment represents bit position four of a bus of inmode 202. B1 register 411 and B2 register 412 correspond to A1 register 311 and A2 register 312. Likewise, multiplexers 401 through 404 respectively correspond to multiplexers 301 through 304. Furthermore, multiplexer 405 corresponds to multiplexer 306. BC output ("BCOUT") signal ("BC output") 443 (illustratively shown in FIG. 2) from multiplexer 404 corresponds to AC output 343, though for this embodiment with a smaller bit width.

Likewise, X multiplexer ("X MUX") signal 442 corresponds to X multiplexer signal 342, though again with a smaller bit width for this embodiment. It should be appreciated that X multiplexer signals 342 and 442 are AB concatenated as generally indicated as AB signal 250 of FIG. 2 for input to an X multiplexer 252.

Output of multiplexer 405 is another multiplier operand signal, namely B multiplier ("B MULT") signal 444 (illustratively shown in FIG. 2), which corresponds to A multiplier signal 344. B multiplier signal 444 and A multiplier signal 344 for this embodiment have different bit widths; however, both outputs may be provided as input operands to a multiplier 251 of FIG. 2. Because dual B register 242 is same or similar to a dual A register portion of preadder 204, repeated description is avoided for purposes of clarity.

With simultaneous reference to FIGS. 2 through 4, DSP slice 200 is further described. Inmode 202 may be considered a dynamic control bus. In addition to inmode 202, there may be a clock signal, a clock enable signal, a set signal, or a reset signal, among other register control signals. These signals are not shown as going into registers for purposes of clarity and not limitation.

AB concatenated signal 250 does not have M register 253 in its path. Thus, a multiply operation between A and B has three pipeline register stages, and an add operation, such as an addition of AB concatenated ("A:B") and C has two register stages. However, by the use of A2 register 312 and B2 register 412, registers A2 312 and B2 412 may be used to provide a register pipeline stage which would otherwise be associated with M register 253. In other words, the number of pipeline stages for inputs to X multiplexer 252 may be configured to be the same within DSP slice 200, which can be used to avoid register misses, namely "bubbles." Accordingly, by setting an operational mode, as described below in additional detail, an A:B+C operation for example and an A*B+C operation for example may both be performed in three clock cycles, e.g., A1 register 311 to A2 register 312 to a P register of FIG. 2 for an A:B+C operation, and A1 register 311 to M register 253 to a P register of FIG. 2 for A of an A*B+C operation (e.g., likewise B1 register 411 to M register 253 to a P register of FIG. 2). A C register of FIG. 2 has one less register than A and B in both of the above examples, but such difference is predictable for all operational modes and thus may be accounted for in FPGA fabric to add in another register stage for C. It should be understood that this allows for dynamically alternating between multiply and add operation on alternate clock cycles without a bubble.

A1 register 311, and A2 register 312, as well as B1 register 411 and B2 register 412, may be used to provide a register file function. Because of the dynamic control bus function of inmode 202, such register file may operate as a random access register file. Alternatively, A1 register 311, and A2 register 312, as well as B1 register 411 and B2 register 412, may be configured to provide shift register logic ("SRL"). Thus dual functionality of both a random access register file and an SRL is provided within DSP slice 200 using dynamic control via an inmode bus 202. Bus, e.g., can mean either a group of signals or a group of signal traces, or both.

Other functionality includes having preadder 204 used as a two-to-one multiplexer, namely by having adder/subtractor 331 select between inputs thereto for output to AD register 314 by having one of the operands be zero. In other words, one of outputs of AND gates 322 and 321 may be respectively forced to zero respectively, responsive to inmode 202-1 and 202-2. Additionally, if output of the A input path is a negative, then a zero may be sourced from the operand input along the D path to adder/subtractor 331 such that adder/subtractor 331 may be used to produce an absolute value of an A or AC operand provided to adder/subtractor 331. Furthermore, by shifting bits using A1 and A2 registers, a twos complement inversion may be performed.

Thus, to recapitulate, inmode 202-0 is used as a none/A1/A2 select signal. Inmode 202-1 may be used to zero output along an A register path, namely registers A1 and A2 ("A registers"). In other words, the ability to zero output facilitates multiplexing between A registers and a D register without using resets and without destroying register contents. When inmode 202-1 is equal to a logic 1, A path input 261 to adder/subtractor 331 is forced to zero, and thus D path input 262 to preadder 331 may be effectively selected for output. Additionally, when inmode 202-1 is equal to logic 1, A path input 261 to multiplexer 305 may be used to force A multiplier signal 344 to zero. However, in order to force A multiplier signal 344 to zero, the D port setting, namely the configuration memory cell setting for providing a control select signal to multiplexer 305 is set for disabling the D port, namely "if use_D port=false."

Inmode 202-2 may be used to zero output of D register 313 along the lines previously described with respect to inmode 202-1 and output of an A register selected path. Thus, D path input 262 to adder/subtractor 331 would be a logic 0, which may be used for facilitating multiplexing between A path input 261 and D path input 262. Furthermore, inmode 202-1 and inmode 202-2 may be used for dynamic power gating for power conservation. If inmode 202-1 is at a logic 1 state, the A path input 261 to adder/subtractor 331 is forced to 0, and if inmode 202-2 is at a logic 0 state, the D path input 262 to adder/subtractor 331 is forced to 0. If both inputs to adder/subtractor 331 are logic 0, operation of adder/subtractor 331 consumes less power as there is no transistor switching within adder/subtractor 331 under such condition. Thus, by "dynamic power gating," it is meant that both inputs to adder/subtractor 331 may be set to logic zero when adder/subtractor 331 functionality is not selected. By having fixed logic values provided as operand inputs to adder/subtractor 331, adder/subtractor 331 does not switch, and this may be used for dynamic conservation of power. In other words, because inmodes may be dynamically set for dynamically fixing operand inputs to adder/subtractor 331, adder/subtractor functionality may be dynamically selected or deselected, and with respect to the later, dynamic power conservation may be implemented.

Inmode 202-3 may be used to have the A operand of A input path 261 either added to or subtracted from the D operand of D input path 262 by adder/subtractor 331. Again, dynamic inversion of an A operand on A input path 261 may be used as an absolute value function. In other words, a register value held in A1 or A2 for example may be dynamically inverted by having the D operand input 262 forced to zero as previously described.

Inmode 202-4 may be used as a B1/B2 register select signal in the same way that inmode 202-0 may be used as an A1/A2 register select signal. Accordingly, it should be appreciated that functionality of DSP slice 200 extends well beyond simply adding a preadder to a DSP as was done in the Spartan™ FPGA DSP 48A available from Xilinx, Inc., of San Jose, Calif.

Furthermore, it should be appreciated that complex multiplication operations may be performed, such as $(A+ai)*(B+bi)=(AB-ab)+(Ab+aB)i$. A and a may be separate operands respectively input to A2 register 312 and A1 register 311 by using separate clock enable signals provided to those registers, and selectively outputting one of such two operands from multiplexer 306 responsive to inmode 202-0. Likewise, B and b may be separate operands respectively input to B2 register 412 and B1 register 411 by using separate clock enable signals provided to those registers, and selectively outputting one of such two operands from multiplexer 405 responsive to inmode 202-4. Operands A, B, a, and b may be stored locally in BRAM. Because of operand reuse, BRAM is only accessed in bursts of every other two clock cycles by DSP slice 200, may be read only once for the example complex multiplication operation, as A1, A2, B1 and B2 registers may be used to locally store the real and imaginary parts of such operands. Even though the example of a complex multiplication was used, it should be understood that the same may be said for performing a sequential multiplication, such as $(A:a)*(B:b)$ for example. For purposes of clarity by way of example and not limitation, suppose 42 bits*34 bits is for (A:a)*(B:b), then the result may be obtained by A*B+sh17(A*0b+B*000000000a+sh17(0b*00000000a), where "sh17" indicates a 17 bit shift.

FIG. 5 is a table diagram depicting an exemplary embodiment of an inmode function table 500. The first five columns of table 500 respectively show possible logic states of inmode bits four through zero respectively corresponding to inmodes 202-4 through 202-0. Inmode 202-4 is a B2/B1 register select signal, and thus if a logic 0 is the state of inmode 202-4 contents of register B2 may be provided as multiplier B port 444 input, and if inmode 202-4 is a logic state 1, multiplier B port 444 input is the contents of B1 register 411. Accordingly, logic 0 and 1 of the first column of table 500 respectively correspond to B2 and B1 of the last column of table 500.

The sixth column of table 500 indicates programming state of a memory cell used to provide control select control of multiplexer 305 of FIG. 3, which is generally indicated as control select signal 501 (illustratively shown in FIG. 3). Thus, control select signal 501 indicates whether the D port, namely D input 201, is in use. As indicated in the first four rows of table 500, a false value indicates that the D port of preadder 204 is not in use. The remaining rows in column 501 indicate a true value for control signal 501 meaning that the D port of preadder 204 is in use.

The seventh column of table 500 indicates the operand input on multiplier A port 344. The possible operand inputs illustratively shown are the values held in A1 or A2 for D registers. Additionally, as previously described, a logic 0 may be provided as A multiplier output 344. Furthermore, the value obtained by adding the operand values of D+A2, D+A1, D−A2, or D−A1, as stored in AD register 314 may be provided as A multiplier output 344. The notation A1/A2 and B1/B2 is used to describe one- and two-deep registers, respectively. If A input operands to adder/subtractor 331 are gated off, then registers D 313 and AD 314 in combination appear like a two-deep registration for D port 201. Thus, the notation D1/D2 respectively refers to D/AD registers for one- and two-deep registration, respectively.

In the Spartan™ FPGA the preadder is positioned between an input register and an output register, where the output register feeds the multiplier. However, this configuration cannot be used for implementing a systolic filter. In the following description, DSP slices 200 are described for implementing a systolic filter.

It should be understood that DSP slice 200 with the addition of preadder 204 and dual B register 242 is capable of supporting sequential complex multiplications, sequential multiplications, and sequential complex conjugate operations. Additionally, the ability to balance the AB concatenation path with the AB multiply path by having A2 and B2 registers essentially be virtual registers with respect to M register 253 allows dynamic switching between multiply and add operations with a three stage pipeline. Furthermore, the ability to dynamically access A1, A2, B1, B2, registers for writing to either of two deep input registers or reading from either of two deep input registers is facilitated by inmode 202, as previously described. Moreover, the flexibility to have zero input to either preadder input port facilitates a multichannel filters.

Three sets of filter coefficients may be locally stored, such as using A1 register 311, A2 register 312, and D register 313 and being able to switch from symmetric to non-symmetric operations dynamically, namely on each clock cycle. Additionally, it should be appreciated that the AD multiplexing capability of using adder/subtractor 331, when add and subtraction functionality is not needed, is supported for dynamic operations. When three sets of filter coefficient are stored locally, then preadder symmetry is not being used. Raw data is being applied via B input port 212 and/or B cascade input port 441 instead of A input port 211 and/or A cascade input port 341, and filter coefficients may be selected by using adder/subtractor 331 to provide a multiplexing function. Thus non-symmetric filters are possible with three sets of filter coefficients.

Figure 6:
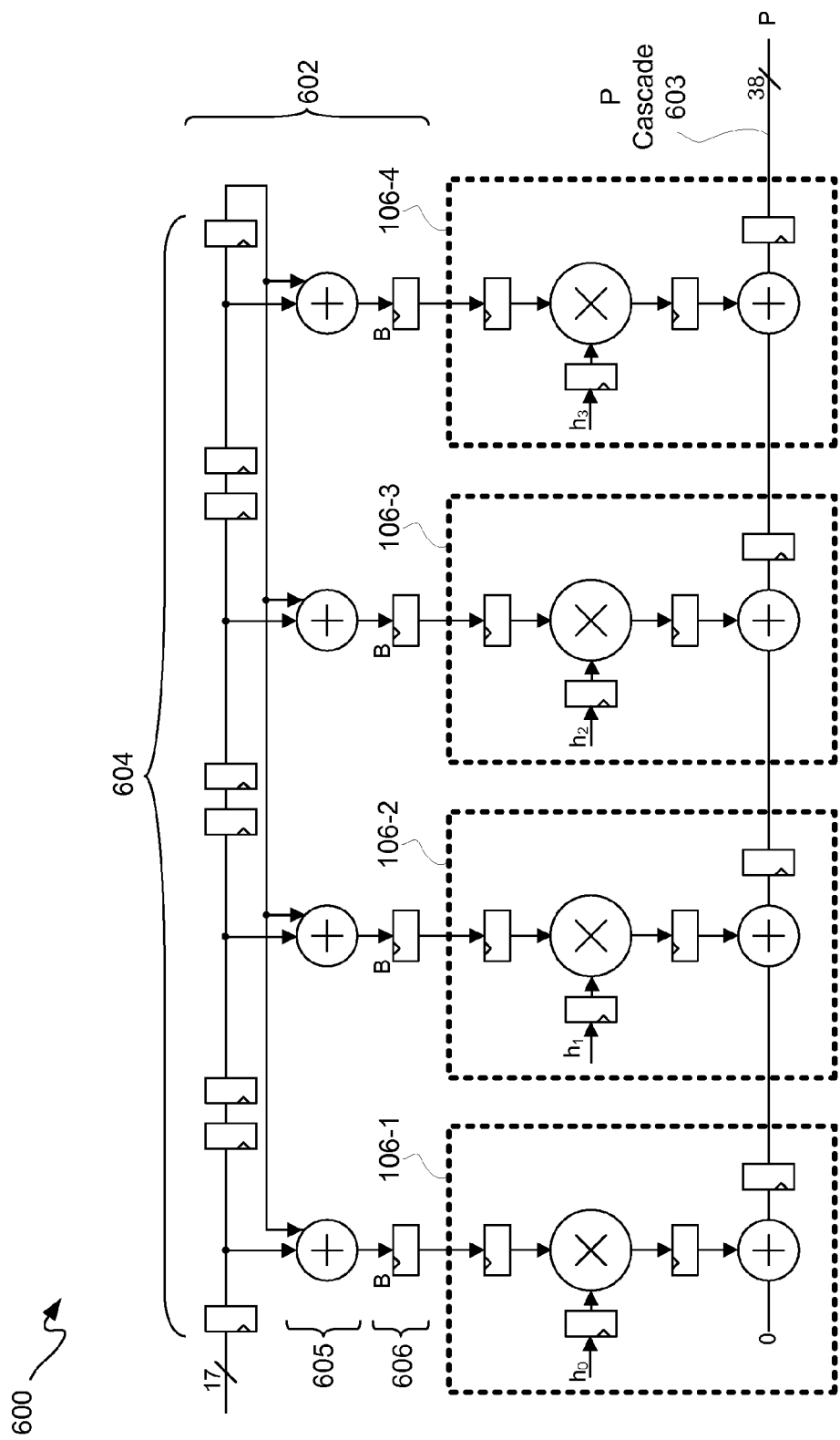
FIG. 6 is a block/circuit diagram depicting an exemplary embodiment of an 8-tap even symmetric systolic finite impulse response ("FIR") filter of the prior art.

FIG. 6 is a block/circuit diagram depicting an exemplary embodiment of an 8-tap even symmetric systolic finite impulse response ("FIR") filter 600 of the prior art. FIR filter 600 is made up of DSP blocks 106 having been programmed with an operational mode ("OPMODE"). Accordingly, DSP blocks 106-1 through 106-4 represent DSPs of the prior art having cascaded outputs to provide a resulting cascaded output, namely "P" cascade 603. Heretofore, shift-register logic ("SRL") 604 was formed of registers in FPGA fabric 602, and thus was an inhibitor to performance. Additionally, the preadder stage 605 and input register stage 606 were previously formed in FPGA fabric 602.

Figure 7:
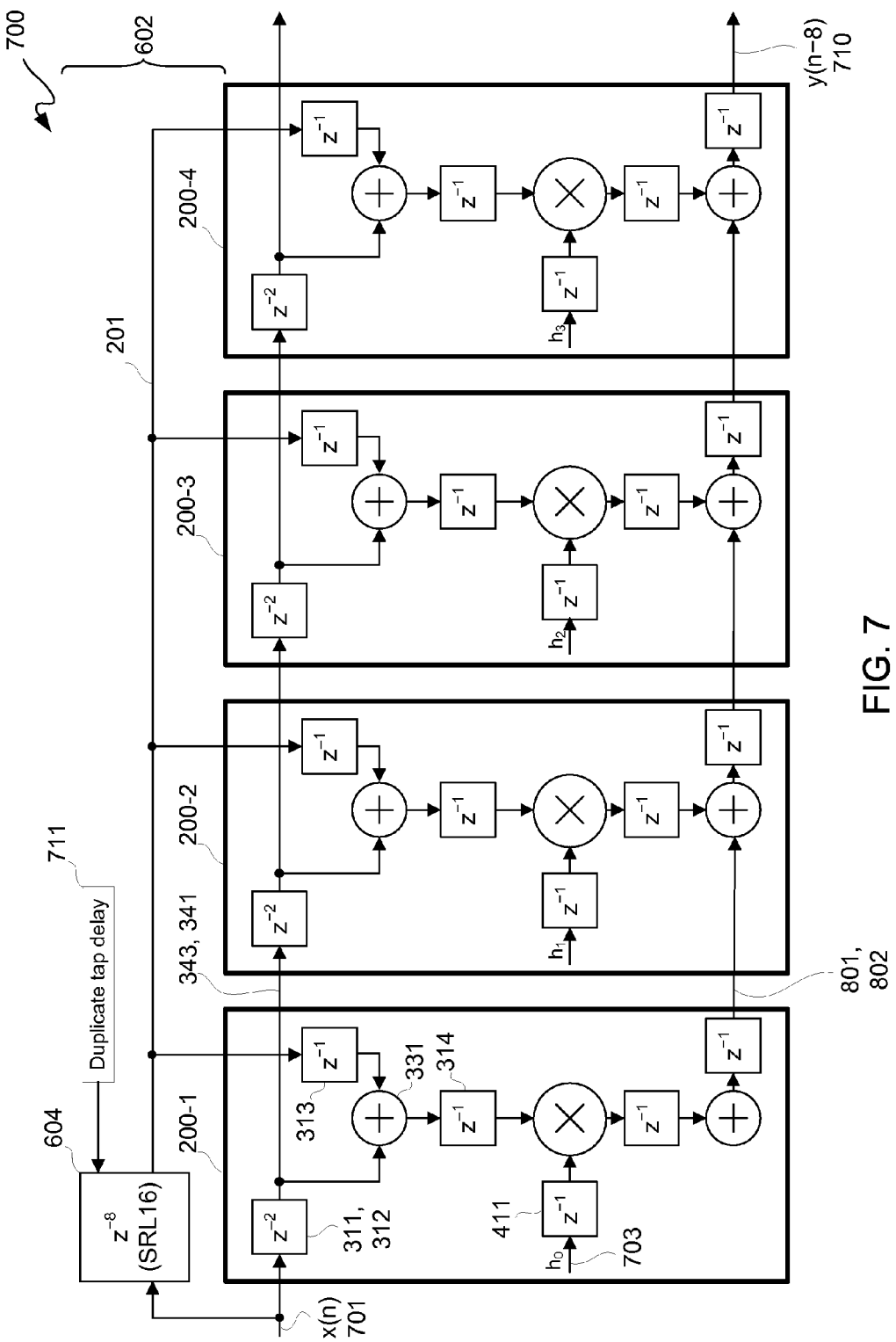
FIG. 7 is a block/circuit diagram depicting an exemplary embodiment of an 8-tap even symmetric systolic FIR filter.

FIG. 7 is a block/circuit diagram depicting an exemplary embodiment of an 8-tap even symmetric systolic FIR filter 700 having DSP slices 200-1 through 200-4. Each of DSP slices 200-1 through 200-4 may be a DSP slice 200 of FIG. 2. With renewed reference to FIGS. 2 through 4 and ongoing reference to FIG. 7, FIR filter 700 is further described. Even though an 8-tap filter is illustratively shown, it should be appreciated that fewer or more than 8 taps may be implemented, and fewer or more than four DSP slices 200 may thus be implemented. DSP slice 200-1 is set for OPMODE of 0,0,0,0,1,0,1 and DSP slices 200-2 through 200-4 are each set with OPMODEs 0,0,1,0,1,0,1. These OPMODEs are the same as for FIR filter 600 of FIG. 6, and, as they were previously known, are not described in unnecessary detail herein.

Even though FIR filter 700 is of a different design than FIR filter 600 of FIG. 6, if register 606 of FIR filter 600 is pushed to the inputs of preadder 605, then an A input, such as A input port 211 of FIG. 2 or filter input x(n) 701 of FIR filter 700, to a preadder 331 has two pipelined delay stages matching two tapped delay line values. Therefore, in contrast to tapping off a register delay line, such as SRL 604, to and connect to an A port register 606 for rebalancing, such tapping may be avoided as illustratively shown with FIR filter 700. Register 606 mirroring on an A input of preadder 605 may be avoided. In other words, such mirroring is not used because a two-deep A register output, namely A registers 311 and 312, may be used to provide for example the same raw data as previously provided via the mirrored path, and therefore such mirrored path may be eliminated. Thus, a mirror register with respect to a register 606 on a D input side of preadder 605 is in effect replaced with a D register 313 in FIR filter 700. A first register in 106-1 is thus a preadder output register, namely AD register 314 in DSP slice 200-1. Besides eliminating the extra register on the preadder A input of FIR filter 600, in FIR filter 700 it is not necessary to simultaneously tap off both A1 and A2 register inputs in contrast to FIR filter 600.

However, in contrast to FIR filter 600, for FIR filter 700, an input register stage 606 is moved to the inputs of the preadder stage 605, a preadder stage 605 along with input registers 606 may be implemented in DSPs, and only SRL 604 is implemented in FPGA fabric 602. SRL 604 is, e.g., a SRL 16, with eight register stages. Input to SRL 604 is filter input x(n) 701, and output from SRL 604 is provided to each D register 313 of DSP slices 200-1 through 200-4 in parallel, namely broadcast.

Filter input x(n) 701 is also provided to an initial register of a chain of DSP slices 200-1 through 200-4. Inputs to FIR filter 700 may be obtained on or off chip with respect to an FPGA in which such FIR filter 700 is implemented. Filter input 701 is provided to A1 and A2 registers 311 and 312 of DSP slice 200-1 and then to A1 and A2 registers of each of the other DSP slices as in the form of a shift register, namely for sequential input. In this embodiment, A1 register 311 and A2 register 312 of DSP slices 200-1 through 200-4 in combination have the same delay or number of register stages as SRL 604.

Filter input 701 to SRL 604 is D input 201 prior to being broadcast to DSP slices 200-1 through 200-4. In this embodiment, because D input 201 is broadcast to each of DSP slices 200-1 through 200-4, it is implemented in FPGA fabric. Filter input 701 is also provided as input A 211 to DSP slice 200-1, namely a first stage DSP slice. However, for input to DSP slices 200-2 through 200-4 such input is AC output 343 provided as AC input 341 to the next stage in the cascade.

Four coefficients $h_0$ through $h_3$ are respectively provided to B input ports, namely B inputs 212 of DSP slices 200-1 through 200-4. In this embodiment, coefficients $h_0$ through $h_3$, namely coefficients 703, are provided to respective B input ports 212 of each of DSP slices 200-1 through 200-4, as such coefficients are not cascaded. In other words, BC input 441 and BC output 443 are not used in this embodiment. Coefficients 703 may be input to either B1 registers 411 or B2 registers 412. For purposes of clarity by way of example and not limitation, it shall be assumed that B1 registers 411 are used; however, it should be appreciated that B2 registers 412 may be used instead of B1 registers 411 or a combination of B1 and B2 registers may be used.

A PC output 802 is cascaded with a PC input 801 between each of the DSP slices. A PC output of DSP slice 200-4 provides the resultant filter output y(n−8) 710. Duplicate tap delay 711 is input to SRL 604 in order to provide for timing adjustments.

Figure 8:
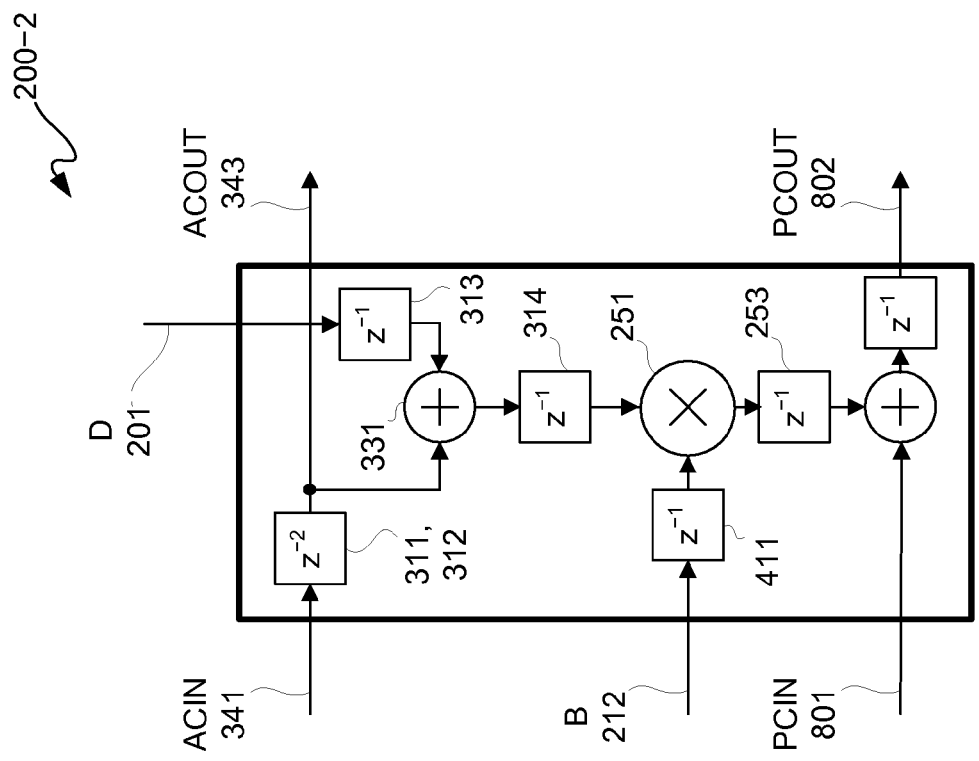
FIG. 8 is a block/circuit diagram depicting an exemplary embodiment of a DSP slice of FIG. 7 with an OPMODE of 0,0,1,0,1,0,1 for implementing a symmetric systolic add-multiply-add processing module.

It should be appreciated that DSP slices 200 may be modeled using VHDL as modular components. FIG. 8 is a block/circuit diagram depicting an exemplary embodiment of DSP slice 200-2. DSP slice 200-2 may have an OPMODE of 0,0,1,0,1,0,1 as previously described for this embodiment for implementing a symmetric systolic add-multiply-add processing module.

Again, AC input 341 is provided to A1 and A2 registers 311 and 312 sequentially. Each D input 201 is provided to D register 313 and outputs of those registers are provided to adder/subtractor 331 in an add mode.

Again, output of registers 312 is sequentially provided as AC output 343 to a downstream DSP slice 200-3, namely the AC input 341 of such downstream DSP slice 200-3. Likewise, AC input 341 is obtained from the AC output 343 of an upstream DSP slice 200-1.

Each B input 212 receives a coefficient to a B register such as B1 register 411. Output of adder/subtractor 331 is provided to AD register 314 and outputs of registers 411 and 314 are provided to multiplier 251.

Output of multiplier 251 is provided to M register 253 and output of M register 253, which is provided to an adder and then a subsequent output register stage, as was done in the prior art and thus not described in unnecessary detail for purposes of clarity. Moreover, as done in the prior art and thus not described in unnecessary detail for purposes of clarity, PC input 801, which may be obtained from a PC output 802 of an upstream DSP slice 200-1 is input to such adder for summing with the output of register 253, and the result of such add may be provided to an output register for providing PC output 802 to a downstream DSP slice 200-3.

Figure 9:
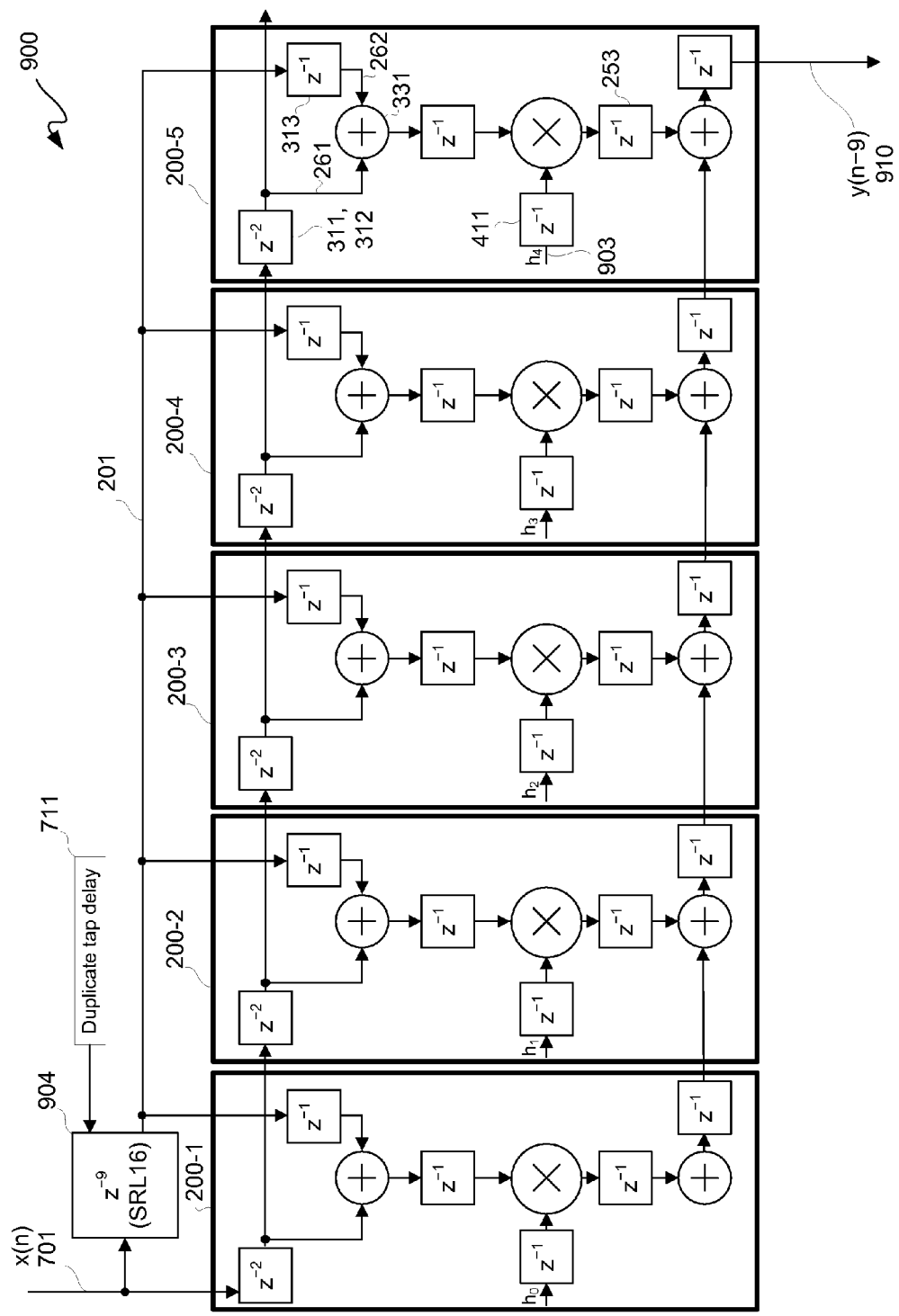
FIG. 9 is a block/circuit diagram depicting an exemplary embodiment of a 9-tap odd symmetric systolic FIR filter.

FIG. 9 is a block/circuit diagram depicting an exemplary embodiment of a 9-tap odd symmetric systolic FIR filter 900. As FIR filter 900 is similar to FIR filter 700 of FIG. 7, only the differences are described for purposes of clarity. SRL 904 is a nine deep shift register for broadcasting D input 201 as previously described. An additional DSP slice, namely DSP slice 200-5 is added as a final stage for producing output y(n−9) 910. Additionally, an additional coefficient $h_4$ of coefficients 903 is provided as an input to B register 411 of DSP slice 200-5. DSP slice 200-5 has the same OPMODE as DSP slices 200-2 through 200-4.

Even though D input 201 may be shifted to register 313 of DSP slice 200-5, DSP slice 200-5 is configured to disable use of D port or a zero is input on D input path 262 to adder/subtractor 331 in an add mode of DSP slice 200-5. Accordingly, it should be appreciated that using dynamic configuration, an odd slice, such as DSP slice 200-5, at a final stage of an FIR filter, such as FIR filter 900, may be dynamically changed for purposes of operating as an odd number of tap filter. Likewise, an A input path 261 may be dynamically changed such that contents in registers 311 and 312 do not show up at adder/subtractor 331 of DSP slice 200-5, but rather a logic 0 is provided to both input ports of adder/subtractor 331.

In other words, by setting inmodes 202-1 and 202-2 appropriately, both inputs to adder/subtractor 331 may be zero. Additionally, for an even number of filter taps, there would not be an odd coefficient, such as $h_4$ 903, and hence coefficient input for any unused tap may be a logic 1 or a logic 0. Thus, output from register 253 may be a logic 0 provided to a final stage adder to provide an output which is in effect y(n−8) 710 of FIG. 7 with an extra pipeline delay. The resulting filter is an 8-tap filter that has the output latency of y(n−9) 910 of FIG. 9. Thus, it should be appreciated that using inmodes 202-1 and 202-2 as previously described, and having an odd number of DSP slices, such a DSP filter may be dynamically adjustable to provide odd or even symmetric systolic FIR filtering. SRL 16 may be dynamically adjusted to accommodate different filter lengths. So, for the preceding example of converting a 9-tap filter to an 8-tap filter whose output is y(n−9) 910, the SRL 16 is $z^{-8}$.

Additionally, in this embodiment, there is a time lag in the operation or shifting of data into an FIR filter, and accordingly dynamic adjustment, as well as the data from one sequence of FIR operations to another sequence of FIR operations may be shadowed in. In other words, without waiting for completion of one FIR operation, such as an odd FIR operation, the data and parameters for a subsequent FIR operation may be shadowed into the FIR filter while still operating the FIR filter to complete the prior FIR operation sequence. The same is true for going from an odd FIR sequence of operations to an even FIR sequence of operations.

Figure 10:
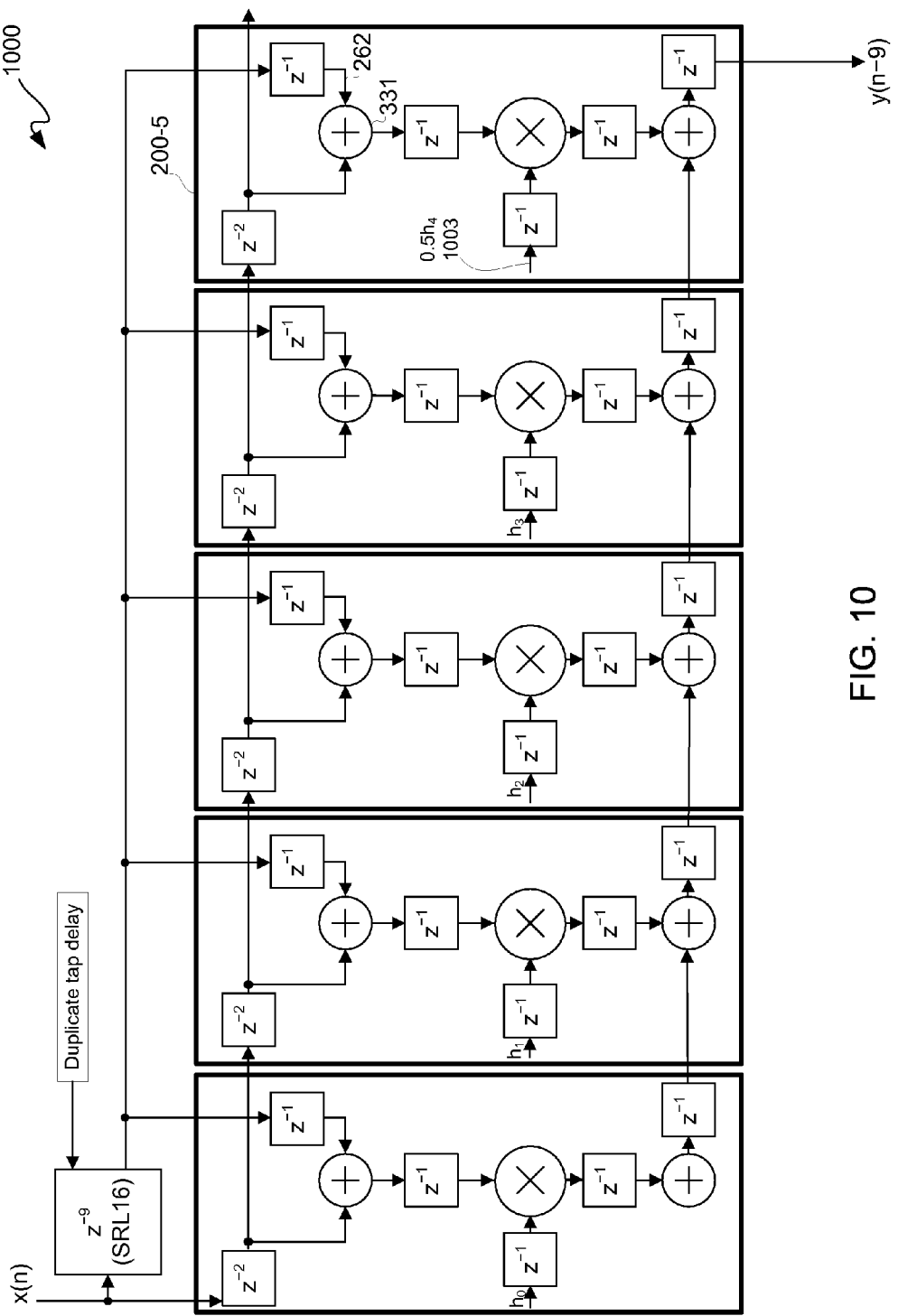
FIG. 10 is a block/circuit diagram depicting an alternative exemplary embodiment of a 9-tap odd symmetric systolic FIR filter.

FIG. 10 is a block/circuit diagram depicting an exemplary embodiment of a 9-tap odd symmetric systolic FIR filter 1000, which is an alternative to FIR filter 900 of FIG. 9. In this embodiment, for an odd operation, adder/subtractor 331 is not in effect having a zero input from D input path 262. Thus, effectively the final DSP slice, which in this embodiment is DSP slice 200-5, adds a number to itself, effectively doubling the number. Accordingly, coefficient 1003 is $0.5h_4$. This means that effectively 2x(n) is multiplied by $0.5h_4$ in DSP slice 200-5 in order to negate the effect of the add by adder/subtractor 331 of such slice. There may be some precision loss in coefficient 1003 in this embodiment; however, this embodiment allows tiling of DSP slices without having to dynamically adjust D input 201 via inmode 202-2.

In either of the embodiments of FIGS. 9 and 10, the last DSP slice effectively bypasses the preadder operation for odd symmetric systolic FIR filtering. The last tap either uses a different processing or forces logic 0s as operand inputs.

Accordingly, in this embodiment, a multiple stage FIR filter may be implemented. Such an FIR filter may be implemented for a longest possible FIR use depending on the application. Such an FIR filter may be used for example in time division multiplexing application, where FIR filters of different lengths are dynamically set without reconfiguration of programmable logic. In other words, a shift register for broadcasting a D input 201 may be set up for the longest FIR filter of a user application; but the SRL delay is dynamically modified to match the number of taps in the filter.

Even though only the last DSP slice of an odd FIR filter was described for dynamic setting using inmode, it should be appreciated that any number of DSP slices at the end an FIR may be dynamically set as such. Accordingly, in the above described 9-tap FIR filter, such FIR filter may be dynamically adjusted from nine taps down to one tap, or even effectively no taps in a bypass mode, without reconfiguration of programmable logic used to implement a shift register. More generally, a filter input series, x(n), may be coupled for input to a chain of DSPs forming an FIR filter for providing a filter output series, y(n−p), where p is an integer number of the effective number of taps and is dynamically adjustable.

It should be appreciated that even though generally fixed coefficients were described, such coefficients may change from application to application. Again, because two-deep register buffering is used, shadowing of information from one FIR depth to the next FIR depth may be used where the transfer is staggered for each of the stages.

Figure 11:
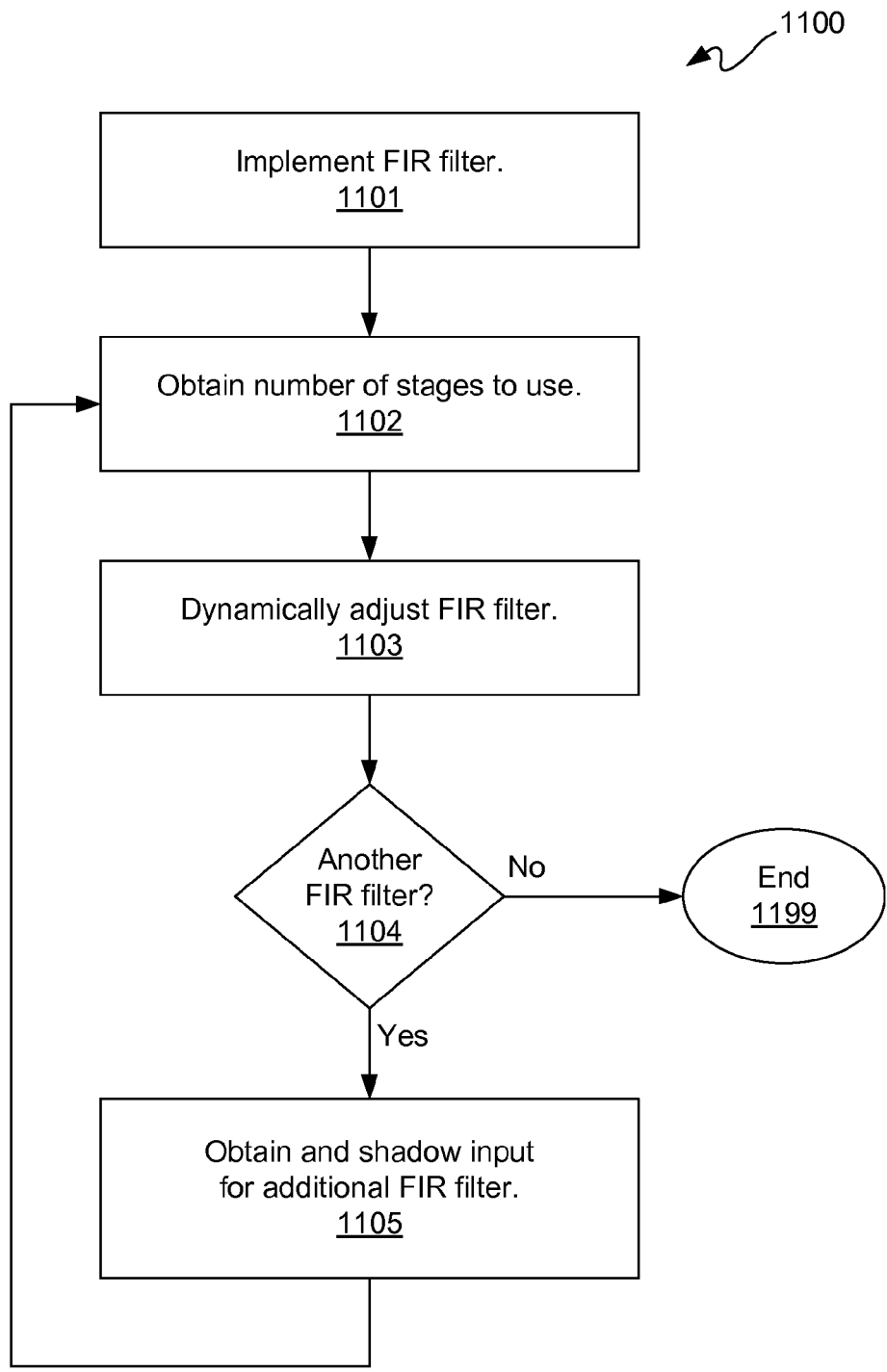
FIG. 11 is a flow diagram depicting an exemplary embodiment of an FIR use flow.

FIG. 11 is a flow diagram depicting an exemplary embodiment of an FIR use flow 1100. At 1101, an FIR filter is implemented having a longest number of stages among all applications to be used. At 1102, a number of stages to use for a then current application is obtained. At 1103, the FIR filter is dynamically adjusted, if not already the correct length, to accommodate the number of stages to be used as found at 1102. At 1104, it is determined whether another FIR sequence is to be performed. If no other FIR sequence is to be performed, flow 1100 may end at 1199. If another FIR sequence is to be performed as determined at 1104, then input for such other FIR sequence may be obtained and shadowed in at 1105 and the number of stages to use may be determined again at 1102 for dynamically adjusting (if needed) the FIR filter at 1103.

Accordingly, it should be appreciated that such a filter may be gated by gating logic for dynamically zeroing out the ending one or more DSP blocks to operate such a filter as having an even number of taps even though there are an odd number of the DSP blocks in the chain. Moreover, such gating logic may be used for dynamically zeroing out the ending one or more DSP blocks to operate such filter as having an odd number of taps even though there are an even number of the DSP blocks in the chain.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit, comprising:
  programmable logic blocks including at least a configurable logic block and a digital signal processing block;
  wherein each digital signal processing block is a dedicated circuit block including a preadder stage, a multiplier stage, an adder stage, internal routing circuitry, and a control bus;
  the control bus coupled to the preadder stage for dynamically controlling operation of the preadder stage;
  the preadder stage including:
    a first input port comprising a control port of a first multiplexer coupled to the control bus;
    a first register and a second register coupled in series via a second multiplexer to the first multiplexer;
    a second input port of a first logic gate coupled to the control bus;
    a third input port of a second logic gate coupled to the control bus; and
    a fourth input port of an adder/subtractor coupled to the control bus, wherein the first multiplexer enables coupling an output of the first register and an output of the second register to the adder/subtractor;
  wherein the adder/subtractor is coupled to an output of the first logic gate and an output of the second logic gate, an output of the adder/subtractor is coupled to the multiplier stage using the internal routing circuitry within the digital signal processing block, an output of the multiplier stage is coupled to the adder stage, and the second input port of the first logic gate and the third input port of the second logic gate enable dynamic power gating for power conservation.

2. The integrated circuit according to claim 1, wherein the preadder stage is configured for dynamically setting a first data input of the adder/subtractor to receive a value of zero via output of the first logic gate responsive to input to the second input port.

3. The integrated circuit according to claim 2, wherein the preadder stage is configured for dynamically setting a second data input of the adder/subtractor to receive the value of zero via output of the second logic gate responsive to input to the third input port.

4. The integrated circuit according to claim 3, wherein the preadder stage is configured for dynamically selecting input data having either a 0-, 1-, or 2-register delay responsive to input to the first input port.

5. The integrated circuit according to claim 4, wherein the preadder stage is configured for dynamically setting the adder/subtractor for either adding or subtracting responsive to input to the fourth input port.

6. The integrated circuit according to claim 5, further comprising field programmable logic gates configured responsive to a configuration bitstream to provide an instantiated circuit function for providing input data to the digital signal processing block.

7. The integrated circuit according to claim 6, wherein:
the preadder stage is dynamically reconfigurable via at least one port of a group consisting of the first input port, the second input port, the third input port, and the fourth input port without having to reconfigure the field programmable logic gates for providing the input data; and
wherein the preadder stage is dynamically reconfigurable to support a function of the digital signal processing block selected from the group consisting of an absolute value function, a sequential complex conjugate function, a sequential multiplication function, a sequential complex multiplication, an multiplexing function, and a shift-register logic function.

8. The integrated circuit according to claim 1, further comprising a chain of digital signal processing blocks having the first digital signal processing block, the chain of digital signal processing blocks configured to implement a systolic finite impulse response filter;
a shift register, coupled to the chain of digital signal processing blocks, the shift register configured to broadcast a broadcast input to each third register of all but an ending one of the digital signal processing blocks of the chain;
each of the digital signal processing blocks having a first register;
each of the digital signal processing blocks having a second register, wherein an output of the first register is coupled to an input of the second register for each of the digital signal processing blocks to provide dual registers thereof, and wherein the dual registers coupled in series for propagating a filter input series from a starting one of the digital signal processing blocks to the ending one of the digital signal processing blocks of the chain;
wherein, for each of the digital signal processing blocks, the preadder stage is coupled for receiving output from each of the first register and the third register, for providing a first sum thereof;
each of the digital signal processing blocks having a fourth register coupled for receiving a respective filter coefficient;
each of the digital signal processing blocks having a multiplier coupled for receiving the first sum and the filter coefficient respectively thereof and configured for providing a partial result thereof; and
each of the digital signal processing blocks having an adder coupled for receiving the partial result thereof, wherein the adders of the digital signal processing blocks are coupled for accumulating the partial result of each of the digital signal processing blocks to provide a filter output series from the ending one of the digital signal processing blocks of the chain.

9. The integrated circuit according to claim 8, wherein an effective length of the chain of digital signal processing blocks is dynamically changed to effectively adjust number of filter taps.

10. An integrated circuit, comprising:
programmable logic blocks including at least a configurable logic block and a digital signal processing block;
wherein each digital signal processing block is a dedicated circuit block including a preadder stage, a multiplier stage, an adder stage, internal routing circuitry, and a control bus;
the control bus coupled to the preadder stage for dynamically controlling operation of the preadder stage;
the preadder stage including:
a first input port comprising a control port of a first multiplexer coupled to the control bus;
a first register and a second register coupled in series via a second multiplexer to the first multiplexer;
a second input port of a first logic gate coupled to the control bus;
a third input port of a second logic gate coupled to the control bus; and
a fourth input port of an adder/subtractor coupled to the control bus, wherein the first multiplexer enables coupling an output of the first register and an output of the second register to the adder/subtractor;
wherein an output of the first logic gate and an output of the second logic gate are coupled to inputs of the adder/subtractor, an output of the adder/subtractor is coupled to the multiplier stage using the internal routing circuitry within the digital signal processing block, an output of the multiplier stage is coupled to the adder stage, and fixed logic values are dynamically provided to inputs of the adder/subtractor to enable dynamic power gating for power conservation.

11. The integrated circuit according to claim 10, wherein the preadder stage is configured for dynamically setting a first data input of the adder/subtractor to receive a value of zero via output of the first logic gate responsive to input to the second input port.

12. The integrated circuit according to claim 11, wherein the preadder stage is configured for dynamically setting a second data input of the adder/subtractor to receive the value of zero via output of the second logic gate responsive to input to the third input port.

13. The integrated circuit according to claim 12, wherein the preadder stage is configured for dynamically selecting input data having either a 0-, 1-, or 2-register delay responsive to input to the first input port.

14. The integrated circuit according to claim 13, wherein the preadder stage is configured for dynamically setting the adder/subtractor for either adding or subtracting responsive to input to the fourth input port.

15. A method of implementing a digital signal processor, the method comprising:
providing programmable logic blocks including at least a configurable logic block and a digital signal processing block, where each digital signal processing block is a dedicated circuit block having a preadder stage, a multiplier stage, an adder stage, internal routing circuitry, and a control bus;

coupling the control bus to the preadder stage for dynamically controlling operation of the preadder stage, wherein the preadder stage includes:
- a first input port comprising a control port of a first multiplexer coupled to the control bus;
- a first register and a second register coupled in series via a second multiplexer to the first multiplexer;
- a second input port of a first logic gate coupled to the control bus;
- a third input port of a second logic gate coupled to the control bus; and
- a fourth input port of an adder/subtractor coupled to the control bus, wherein the first multiplexer enables coupling an output of the first register and an output of the second register to the adder/subtractor, wherein the adder/subtractor is coupled to an output of the first logic gate and an output of the second logic gate, an output of the adder/subtractor is coupled to the multiplier stage using the internal routing circuitry within the digital signal processing block, and an output of the multiplier stage is coupled to the adder stage; and enabling power gating for power conservation by setting inputs to the adder/subtractor using the first logic gate and the second logic gate.

16. The method according to claim 15, wherein enabling power gating comprises configuring the preadder stage for dynamically setting a first data input of the adder/subtractor to receive a value of zero via output of the first logic gate responsive to input to the second input port.

17. The method according to claim 16, wherein enabling power gating comprises configuring the preadder stage for dynamically setting a second data input of the adder/subtractor to receive the value of zero via output of the second logic gate responsive to input to the third input port.

18. The method according to claim 17, further comprising configuring the preadder stage for dynamically selecting input data having either a 0-, 1-, or 2-register delay responsive to input to the first input port.

19. The method according to claim 18, further comprising configuring the preadder stage for dynamically setting the adder/subtractor for either adding or subtracting responsive to input to the fourth input port.

20. The method according to claim 19, further comprising dynamically reconfiguring the preadder stage via at least one port of a group consisting of the first input port, the second input port, the third input port, and the fourth input port without having to reconfigure the field programmable logic gates for providing the input data.

* * * * *